(12) United States Patent
Hamada et al.

(10) Patent No.: US 7,651,829 B2
(45) Date of Patent: Jan. 26, 2010

(54) POSITIVE RESIST MATERIAL AND PATTERN FORMATION METHOD USING THE SAME

(75) Inventors: Yoshitaka Hamada, Niigata-ken (JP); Fujio Yagihashi, Niigata-ken (JP); Mutsuo Nakashima, Niigata-ken (JP); Kazumi Noda, Niigata-ken (JP); Katsuya Takemura, Niigata-ken (JP)

(73) Assignee: Shin-Etsu Chemical Co., Ltd., Niigata-Ken (JP)

(*) Notice: Subject to any disclaimer, the term of this patent is extended or adjusted under 35 U.S.C. 154(b) by 100 days.

(21) Appl. No.: 10/854,568

(22) Filed: May 26, 2004

(65) Prior Publication Data
US 2004/0241579 A1 Dec. 2, 2004

(30) Foreign Application Priority Data
May 27, 2003 (JP) .............................. 2003-148471

(51) Int. Cl.
G03F 7/039 (2006.01)
G03F 7/20 (2006.01)
G03F 7/30 (2006.01)
G03F 7/36 (2006.01)
G03F 7/38 (2006.01)

(52) U.S. Cl. .................... 430/270.1; 430/313; 430/326; 430/330; 430/942; 528/12; 528/40; 528/41; 528/42; 528/43

(58) Field of Classification Search ........................ None
See application file for complete search history.

(56) References Cited

U.S. PATENT DOCUMENTS

| | | | |
|---|---|---|---|
| 4,491,628 A | 1/1985 | Ito et al. | |
| 4,745,044 A * | 5/1988 | Gregor ....................... | 430/312 |
| 4,977,200 A * | 12/1990 | Itoh et al. .................... | 523/223 |
| 5,827,921 A * | 10/1998 | Osawa et al. ................ | 524/837 |
| 5,843,624 A | 12/1998 | Houlihan et al. | |
| 5,886,119 A | 3/1999 | Schaedeli et al. | |
| 5,968,713 A | 10/1999 | Nozaki et al. | |
| 5,972,560 A | 10/1999 | Kaneko et al. | |
| 6,013,416 A | 1/2000 | Nozaki et al. | |
| 6,028,154 A | 2/2000 | Schaedeli et al. | |
| 6,042,989 A | 3/2000 | Schaedeli et al. | |
| 6,200,725 B1 | 3/2001 | Takechi et al. | |
| 6,309,796 B1 | 10/2001 | Nakashima et al. | |
| 6,329,125 B2 | 12/2001 | Takechi et al. | |
| 6,623,909 B2 * | 9/2003 | Hatakeyama et al. .... | 430/270.1 |
| 2001/0003640 A1 | 6/2001 | Takechi et al. | |
| 2001/0053570 A1 * | 12/2001 | Kido ........................... | 438/149 |
| 2003/0073040 A1 * | 4/2003 | Iwasawa et al. ............. | 430/312 |
| 2005/0196699 A1 * | 9/2005 | Kanagasabapathy et al. ......................... | 430/270.1 |
| 2005/0244745 A1 * | 11/2005 | Cameron et al. .......... | 430/270.1 |

FOREIGN PATENT DOCUMENTS

| | | |
|---|---|---|
| EP | 0 249 139 | 6/1987 |
| JP | 6-118651 | 4/1994 |
| JP | 9-230595 | 9/1997 |
| JP | 2002-268225 A | 9/2002 |
| JP | 2002-308990 A | 10/2002 |
| JP | 2003-020335 A | 1/2003 |
| JP | 2004-295104 A | 10/2004 |
| WO | WO 97/33198 | 9/1997 |

OTHER PUBLICATIONS

Satou et al., "Study of bilayer silylation process for 193 nm lithography using chemically amplified resist," *J. Vac. Sci. Technol.*, B 17(6), pp. 3326-3329, Nov./Dec. 1999.
Chiba et al., "157 nm Resist Materials: A Progress Report," *J. Photopolym. Sci. Technol.*, vol. 13, No. 4, pp. 657-662, Jun. 2000.
Schmaljohann et al., "Fundamental Studies of Fluoropolymer Photoresists for 157 nm Lithography," *J. Photopolym. Sci. Technol.*, vol. 13, No. 3, pp. 451-458, May 2000.
Brunsvold et al., "Evaluation of a Deep UV Bilayer Resist for Sub-Half Micron Lithography," *Proc. SPIE*, vol. 1925, pp. 377-387, Sep. 1993.
Hatakeyama et al., "Investigation of Discrimination Enhancement in Polysilsesquioxane-Based Positive Resists for ArF Lithography," *Proc. SPIE*, vol. 3333, pp. 62-72, Jun. 1998.
Schaedeli et al., "Evaluation of Materials for 193-nm Lithography," *J. Photopolym. Sci. Technol.*, vol. 9, No. 3, pp. 435-446, May 1996.

(Continued)

*Primary Examiner*—Sin J. Lee
(74) *Attorney, Agent, or Firm*—Alston & Bird LLP

(57) ABSTRACT

Provided is a positive resist material, particularly a chemically amplified positive resist material having higher sensitivity, higher resolution, a higher exposure latitude and better process adaptability than conventional positive resist materials, and providing a good pattern profile after exposure, particularly having lessened line edge roughness and exhibiting excellent etching resistance. These materials may contain, preferably an organic solvent and acid generator, more preferably a dissolution inhibitor or a basic compound and/or a surfactant. Provided is a positive resist material comprising a polymer comprising at least one monomer unit selected from a group consisting of a monomer unit (A), a monomer unit (B) and a monomer unit (C) represented by the following formula (1); and having a glass transition temperature (Tg) of 100° C. or greater.

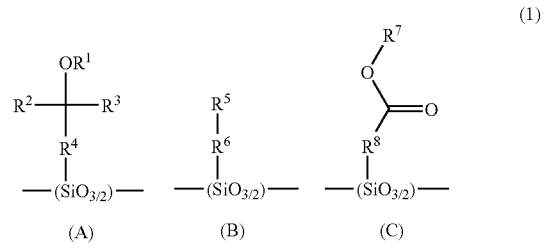

8 Claims, 2 Drawing Sheets

OTHER PUBLICATIONS

Kessel et al., "Novel Silicon-Containing Resists for EUV and 193 nm Lithography," *Proc. SPIE*, vol. 3678, pp. 214-220, Jun. 1999.

Lin et al., "A High Resolution 248 nm Bilayer Resist," *Proc. SPIE*, vol. 3678, pp. 241-250, Jun. 1999.

Boardman et al., "Chemical Aspects of Silicon-Containing Bilayer Resists," *Proc. SPIE*, vol. 3678, pp. 562-572, Jun. 1999.

Kim et al., "Chemically amplified resist based on the methacrylate polymer with 2-trimethylsily1-2-propyl ester protecting group," *Proc. SPIE*, vol. 3678, pp. 420-428, Jun. 1999.

International Sematech, "157 nm Lithography Data Review," MIT-LL Boston, MA, May 5, 1999, Workshop Presentations.

* cited by examiner

US 7,651,829 B2

POSITIVE RESIST MATERIAL AND PATTERN FORMATION METHOD USING THE SAME

CROSS-REFERENCE TO RELATED APPLICATIONS

The present application claims priority to Japanese Patent Application No. 2003-148471, filed May 27, 2003, the disclosure of which is incorporated herein by reference in its entirely.

BACKGROUND OF THE INVENTION

1. Field of the Invention

The present invention relates to a silicon-containing polymer suited as a base resin for a chemically amplified positive resist material used for microfabrication in the manufacture of a semiconductor device and the like; a resist material, particularly chemically amplified positive resist material suited when high energy radiation such as far UV radiation, KrF excimer laser light (248 nm), ArF excimer laser light (193 nm), $F_2$ laser light (157 nm), electron beam and X-ray is used as an exposure light source; and a pattern formation method.

2. Description of the Related Art

With a trend to higher integration and higher operating speeds in LSI devices, the pattern rule has become finer rapidly. Such a rapid progress is attributable to an increase in the NA of a projection lens, improvement in the performance of a resist, and employment of an exposure light having a shorter wavelength. In particular, transition from i-line (365 nm) to shorter wavelength exposure light of KrF laser (248 nm) has brought about a great innovation, making it possible to produce 0.18 µm rule devices. In the trend toward resist materials with a higher resolution and sensitivity, chemically amplified positive resist materials (as described in Japanese Patent Provisional Publication Nos. 02-027660/1990 and 63-027829/1988) using an acid as a catalyst have excellent characteristics so that they become leading resist materials in far UV lithography.

Use of resist materials for KrF excimer laser was started popularly for a 0.3 micron process. After a 0.25 micron rule, a 0.18 micron rule is now adopted for mass production. Moreover, trial manufacture on a 0.15 µm rule is started and even 0.13 µm rule is under investigation. Thus, the pattern rules have become finer in an accelerating pace. Transition from KrF to shorter wavelength ArF (193 nm) is expected to miniaturize the design rule to 0.13 µm or less. Conventionally used novolac resins or polyvinylphenol resins, however, cannot be used as a base resin for resists, because they have very strong absorption in the vicinity of 193 nm. To ensure transparency and necessary dry etching resistance, use of acrylic or alicyclic resins such as cycloolefin have been investigated (Japanese Patent Provisional Publication Nos. 09-073173/1997, 10-010739/1998, 09-230595/1997 and WO97/33198). With respect to $F_2$ laser light (157 nm) which is expected to enable further miniaturization to 0.10 µm or less, difficulty in ensuring transparency increases further, and it has been found that acrylic resins do not permit light transmission therethrough at all and cycloolefin resins having carbonyl bonds have strong absorption. Polymers having a benzene ring have a little improved absorption at a wavelength in the vicinity of 160 nm, which is far-below the practically acceptable level. It has been found that in a monolayer resist, a reduction in carbon-to-carbon double bonds as typified by a benzene ring and carbon-to-oxygen double bonds as typified by a carbonyl group is indispensable for having an adequate light transmittance (International Work Shop 157 nm Lithography MIT-LL Boston, Mass. May 5, 1999). It is reported that introduction of fluorine is effective for improving transmittance (J. Vac. Sci. Technol. B 17(6), November/December 1999). A number of fluorine-containing polymers for resist are proposed (J. Photopolymer Sci. and Techno Vol. 13 No. 4 (2000) p 652-657 and Vol. 13 No. 3 (2000) p 451-458). The transmittance of these polymers, however, does not reach that of polyhydroxystyrene or derivatives thereof adapted for KrF exposure, and poly(meth)acrylic derivatives or polycycloolefin derivatives adapted for ArF exposure.

It is conventionally known that the bilayer resist technique is excellent in the formation of a pattern having a high aspect ratio over a stepped substrate. It is also known that a high-molecular silicone compound having a hydrophilic group such as hydroxy or carboxyl group is necessary for the development of a bilayer resist film in an ordinarily employed alkaline developer.

Proposed is a silicone-type chemically-amplified positive resist material for KrF excimer laser comprising a polyhydroxybenzylsilsesquioxane, which is a stable alkali-soluble silicone polymer having some of the phenolic hydroxyl groups protected with a t-Boc group, and an acid generator (Japanese Patent Provisional Publicatin No. 06-118651/1994, SPIE vol. 1925 (1993) p 377 and others). A positive resist material based on the silsesquioxane obtained by substituting cyclohexylcarboxylic acid with an acid-labile group is proposed for ArF excimer laser (Japanese Patent Provisional Publication Nos. 10-324748/1998, 11-302382/1999 and SPIE vol. 3333-07(1998) p 62). As a resist for $F_2$ laser, proposed is a positive resist material based on the silsesquioxane having hexafluoroisopropanol as a dissolvable group (Japanese Patent Provisional Publication No. 2002-055456).

A silicon-containing (meth)acrylate ester is proposed as a base polymer for resist having silicon as a pendant side chain (Japanese Patent Provisional Publication No. 09-110938/1997 and J. Photopolymer Sci. and Technol. Vo. 9 No. 3(1996) p 435-446).

The silicon-containing polymer of the (meth)acrylate type has a drawback that dry etching resistance thereof with oxygen plasma is weaker than that of a silsesquioxane polymer. This weak dry etching resistance owes to a low silicon content and a difference in the main skeleton of the polymer. The siloxane pendant type of (meth)acrylate also has the drawback that it easily repels a developer and is inferior in wettability with the developer. With a view to overcoming these problems, a trisilane or tetrasilane pendant type of (meth)acrylate-containing polymer having an increased silicon content and an increased alkali dissolution by imparting the silicon-containing group with acid elimination property is proposed (SPIE vol. 3678 p 214, p 241, p 562). Although this polymer shows a strong absorption at a wavelength not greater than 200 nm because of having silicon-silicon bonds, it is used as a polymer having a silicon-containing and acid-eliminating group, which polymer has transparency high enough as a polymer for KrF excimer laser light of 248 nm and is excellent in etching resistance. In addition, the other silicon-containing and acid-labile groups have been investigated (SPIE vol. 3678 p 420).

The term "(meth)acrylic" means methacrylic and/or acrylic.

SUMMARY OF THE INVENTION

An object of the present invention is to provide, with the foregoing in view, a positive resist material, particularly, a chemically amplified positive resist material having a sensitivity, resolution, exposure latitude and process adaptability superior to those of the conventional positive resist materials, having a good pattern shape after exposure without large line edge roughness, and exhibiting excellent etching resistance.

One of the drawbacks of the polysilsesquioxane-base silicon-containing resist is that it has a low glass transition temperature (Tg) owing to low molecular weight. When the glass transition temperature is low, the acid in the resist tends to diffuse during post exposure bake (PEB), resulting in lowering in the resolution and widening of a difference (proximity bias) of the resist pattern between isolated and dense features. They cause inconveniences upon practical use. An increase in the molecular weight is necessary for heightening of the Tg. By an increase in the molecular weight, the polysilsesquioxane becomes a gel, which causes a reduction in its solubility in a solvent or drastic deterioration in the evenness of a film thickness after spin coating.

Another method for heightening the Tg is to increase the condensation degree of the polysilsesquioxane. That is, siloxane bonds are formed densely by maturing the polysilsesquioxane in a long period of time under an anhydrous condition in the presence of a catalyst because the number of remaining silanol groups or alkoxy groups is decreased. As an indication of the condensation degree, attention is paid to a signal strength ratio of T1/T2/T3 as measured by $^{29}$SiNMR. It has been found that in $^{29}$SiNMR, upon observation of a signal strength ratio of the signal strength of T1 observed at −45 to −55 ppm, the signal strength of T2 observed at −55 to −65 ppm, and the signal strength of T3 observed at −65 to −75 ppm, a highly condensed polysilsesquioxane having an existing ratio of T3 equivalent to or exceeding 60%, though depending on the kind of side chain group, has a higher Tg compared with the other one and becomes a polysilsesquioxane having a Tg of 100° C. or greater, leading to the completion of the invention.

In the present invention, proposed is a positive resist material comprising as a base resin a polymer represented by the formula (1).

In the present invention, there is thus provided a positive resist material comprising a polymer comprising at least one monomer unit selected from a group consisting of a monomer unit (A), a monomer unit (B) and a monomer unit (C) represented by the following formula (1) and having a glass transition temperature (Tg) of 100° C. or greater. As a base resin, comprised is the polymer represented by the formula (1):

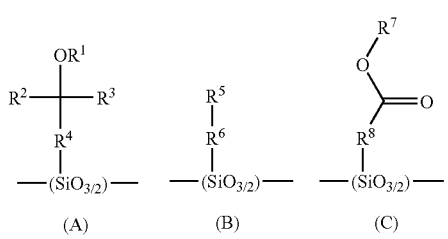

wherein $R^1$ represents a hydrogen atom, an alkyl group or an acyl group; $R^2$ and $R^3$ each independently represents a hydrogen atom, a fluorine atom, a $C_{1-4}$ alkyl group or a $C_{1-4}$ alkyl group having at least one fluorine atom; $R^5$ represents a halogen atom, an organic group, an acyl group, an acyloxy group, or an alkoxycarbonyl group; $R^7$ represents an acid-labile group; and $R^4$, $R^6$ and $R^8$ each independently represents a linear, branched, cyclic or bridged cyclic $C_{3-20}$ alkylene group or a $C_{6-20}$ arylene group.

The resist material of the invention may comprise, preferably an organic solvent and an acid generator, more preferably a dissolution inhibitor, or a basic compound and/or a surfactant.

In the present invention, there is also provided a pattern formation method comprising steps of coating a substrate with the resist material; heating the coated substrate; exposing the substrate to high energy radiation or electron beam not greater than the wavelength of 300 nm through a photomask; optionally heating the exposed substrate; and developing with a developer. In a preferred embodiment of the invention, the method may further comprise, after the development step, treating the substrate with oxygen plasma etching; or treating the exposed substrate with a halogen gas etching, the halogen gas containing chlorine or bromine.

DETAILED DESCRIPTION OF THE PREFERRED EMBODIMENTS

Figure 1A:
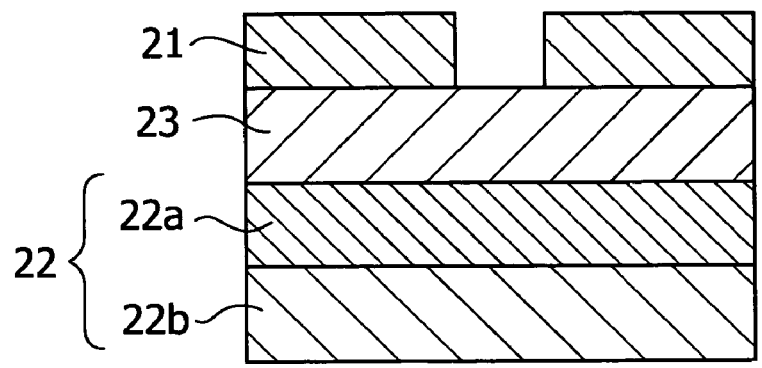
FIG. 1 illustrates one example of the pattern formation method of the present invention, in which (a) resist pattern after development, (b) pattern after dry etching with an oxygen gas, (c) pattern after dry etching of a layer to be processed are shown.

The embodiments of present invention will hereinafter be described more specifically. However, it should not be construed that the present invention is limited to them.

The present inventors have proceeded with an intensive investigation with a view toward obtaining a positive resist material for silicon-containing bilayer processing which has high sensitivity and high resolution, and exposure latitude, particularly has small line edge roughness and exhibits excellent resistance against etching with an oxygen gas and thereby satisfying the recent demand for resist materials. As a result, it has been found that polysiloxane, especially polysilsesquioxane, which has Tg of 100° C. or greater and which contains, as a pendant, norbornene substituted with a substituted or unsubstituted alcohol having a trifluoromethyl group linked at the a position, is very effective as a base resin for a positive resist material, particularly for a chemically amplified positive resist material, leading to the completion of the present invention.

That is, the present inventors have investigated in order to attain improvement in resistance against etching with an oxygen gas, reduction in the molecular weight of the polymer and at the same time, heightening of Tg.

It is usually known that the Tg of a cycloolefin polymer is higher than that of an olefin polymer. For example, the Tg of a norbornene/maleic anhydride copolymer is higher by at least 100° C. than that of polymethyl methacrylate. The cycloolefin polymer is rigid without free rotation of the main chain so that its Tg is high. Heightening of Tg can also be attained by introducing a rigid cyclo group to the side chain. For example, Tg of methyl methacrylate having a Mw of 10,000 is about 100° C., while that of adamantane methacrylate having a similar level of molecular weight is 180° C.

Polysilsesquioxanes are said to have a main chain with a rigid ladder type structure and they involve such a drawback of low Tg because the molecular weight (Mw) falls within a range of from 1,000 to 4,000. It has been understood based on the $^{29}$SiNMR analysis that all the polysilsesquioxanes do not have a complete ladder structure and not few polymers contain the T3 unit in an amount less than 60%. With regards to the molecular weight, p-hydroxybenzylsilsesquioxane having a molecular weight Mw of 3,000 has a Tg of 140° C., which lowers to 100° C. by the substitution with an acid-labile group. Monodisperse p-hydroxystyrene having a molecular weight Mw of 10,000 has a Tg of 180° C. and that substituted with an acid-labile group has a Tg of 140° C. Compared with it, a Tg of the former one is lower by 40° C. Polyhydroxystyrene substituted with an acid-labile group or a butyl acrylate/polyhydroxystyrene copolymer has a Tg of from 130 to 140° C. A resist suited for practical use is required to have a Tg of 130° C. or greater. The PEB temperature for deprotecting the acid-labile group may be generally 100° C. or greater so that when the Tg is around 100° C., an acid diffusion distance shows a drastic increase at the PEB temperature of 100° C. or greater. In order to overcome such a problem, post exposure baking at low temperature while using an acid-labile group which is deprotected at lower temperature can be considered as a possible method. When a protecting group whose activation energy for deprotection reaction is low is employed, however, there is a potential danger that deprotection proceeds during exposure and a gas component emitted by deprotection adsorb to the exposure apparatus or mask so that the transmittance of the lens or mask lowers. It is desired to use an acid-labile group having a high activation energy and deprotect it at a high PEB temperature in order to prevent degassing during exposure. Hence, base polymers having a high Tg are desired.

An increase in the content of T3 by improving the condensation degree of a polysilsesquioxane is expected to lessen the line edge roughness without increasing the acid diffusion in PEB even when the Tg is high and molecular weight is low.

The present inventors prepared a silsesquioxane having a Tg of 100° C. or greater, preferably 130° C. or greater by maturing a polysilsesquioxane, which has been obtained by conventional hydrolysis/condensation in the presence of an anhydrous/basic catalyst, to densify the network of a siloxane and heighten the condensation degree to the limit and thereby raising Tg. They reached the idea of using it as a base resin for a positive resist material, particularly chemically amplified positive resist material.

According to the present invention, the polymer may be one at least having a repeating unit represented by the following formula (1) and having a Tg of 100° C. or greater.

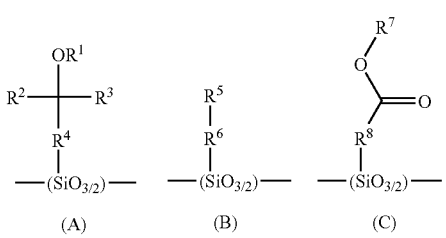

In the formula (1), $R^1$ represents a hydrogen atom, an alkyl group (preferably, $C_{1-10}$) or an acyl group (preferably $C_{2-5000}$) $R^2$ and $R^3$ each independently represents a hydrogen atom, a fluorine atom, a $C_{1-4}$ alkyl group or a $C_{1-4}$ alkyl group having at least one fluorine atom.

$R^5$ represents a halogen atom, an alkyl group, an oxoalkyl group, an acyl group (preferably, $C_{2-10}$), an acyloxy group (preferably, $C_{2-10}$), or an oxycarbonyl group (preferably, $C_{2-10}$), while $R^7$ represents an acid-labile group.

$R^4$, $R^6$ and $R^8$ each independently represents a linear, branched, cyclic or bridged cyclic $C_{3-20}$ alkylene group or a $C_{6-20}$ arylene group.

A positive resist material comprising such a polymer as a base resin and optionally comprising an appropriate combination of an organic solvent, an acid generator, a dissolution inhibitor, a basic compound, a surfactant and the like. It features a high dissolution contrast and high resolution of the resulting resist film, adequate exposure latitude, excellent process adaptability, good pattern shape after exposure, and excellent etching resistance, and in particular, it has small line edge roughness. Accordingly, it is suited for practical use and can be used as an effective resist material for ultra LSI devices. When it is a chemically amplified positive resist material further comprising an acid generator, the resist material making use of an acid catalytic reaction, it becomes markedly useful with higher sensitivity and various properties improved further.

The repeating unit represented by the formula (1) can be obtained by hydrolysis condensation of a silane compound represented by the following formula (2):

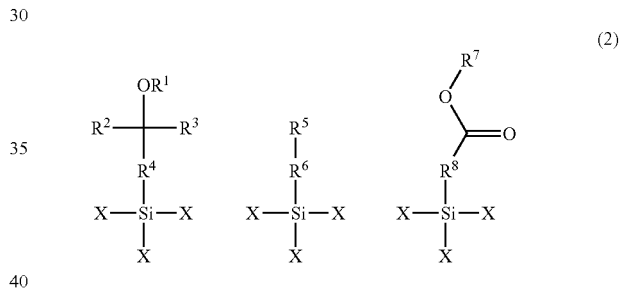

wherein $R^1$ to $R^8$ have the same meanings as described above; and Xs may be the same or different and each represents a $C_{1-10}$ alkyl group, an aryl group, a trifluoropropyl group, a hydroxy group, a $C_{1-4}$ alkoxy group or a halogen atom and at least two of the three X groups in one compound are each a hydroxyl group, a $C_{1-4}$ alkoxy group or a halogen atom.

When chlorosilane is used for the reaction with silane, the hydroxyl group reacts with the chlorosilane so that the hydroxyl group may be preferably acetylated or pivaloylated in advance.

The compound represented by the formula (2) may be produced by the addition reaction (hydrosilylation) between a corresponding olefin derivative and a trialkoxysilane or tri-halogenated silane. The hydrosilylation may proceed in accordance with the following reaction scheme and can be performed under ordinary pressure or under added pressure in an autoclave at room temperature or under heating in the presence of a platinum or palladium catalyst.

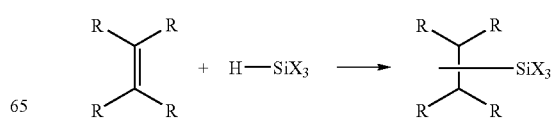

Specific examples of the olefin will next be described. Examples of (1) fluorine-containing olefin may include substituted or unsubstituted (2-hydroxy-2,2-bistrifluoromethyl)ethyl-containing norbornene derivatives, hydroxytrifluoromethyl-containing norbornene-derivatives, and (1-hydroxy-1,1-bistrifluoromethyl)methyl-containing norbornene derivatives.

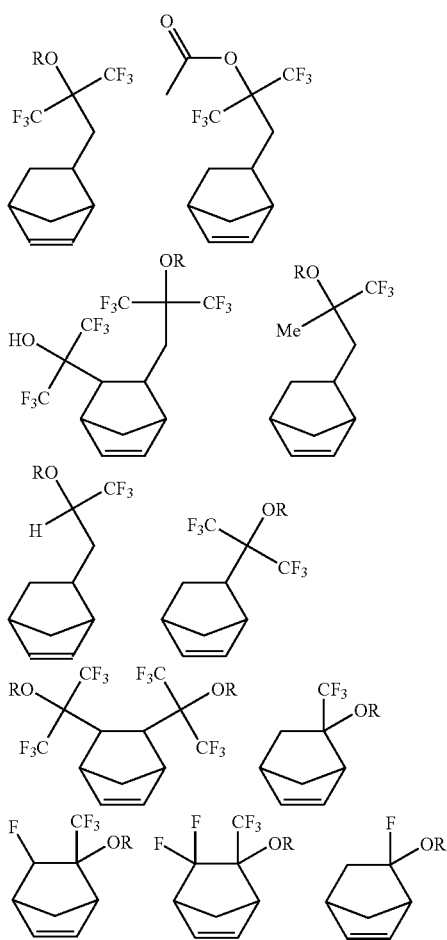

In the above-described formulas, R represents a hydrogen atom or an acyl group.

These derivatives can be obtained, for example, by synthesizing (2-hydroxy-2,2-bistrifluoromethyl)ethyl-containing olefin or hydroxytrifluoromethyl-containing olefin by the Diels-Alder reaction between 1,1-bistrifluoromethyl-3-buten-1-ol or α-trifluorovinylalcohol and cyclopentadiene, followed by the Diels-Alder reaction with cyclopentadiene.

The following is a synthesis example of (2) a silane monomer used as a repeating unit (C) in the formula (1).

In a similar manner to that employed above, a cycloolefin compound having a carboxylate substituted with an acid-labile group, particularly cyclobutenecarboxylic acid, cyclopentenecarboxylic acid, or cyclohexenecarboxylic acid each substituted with an acid-labile group, or norbornene carboxylate, 4-oxonorbornene carboxylate, tricylcodecene carboxylate, or tetracyclododecene carboxylate each substituted with an acid-labile group may be subjected to hydrosilylation reaction.

The following are examples of the cycloolefin compound having a carboxylate substituted with an acid-labile group.

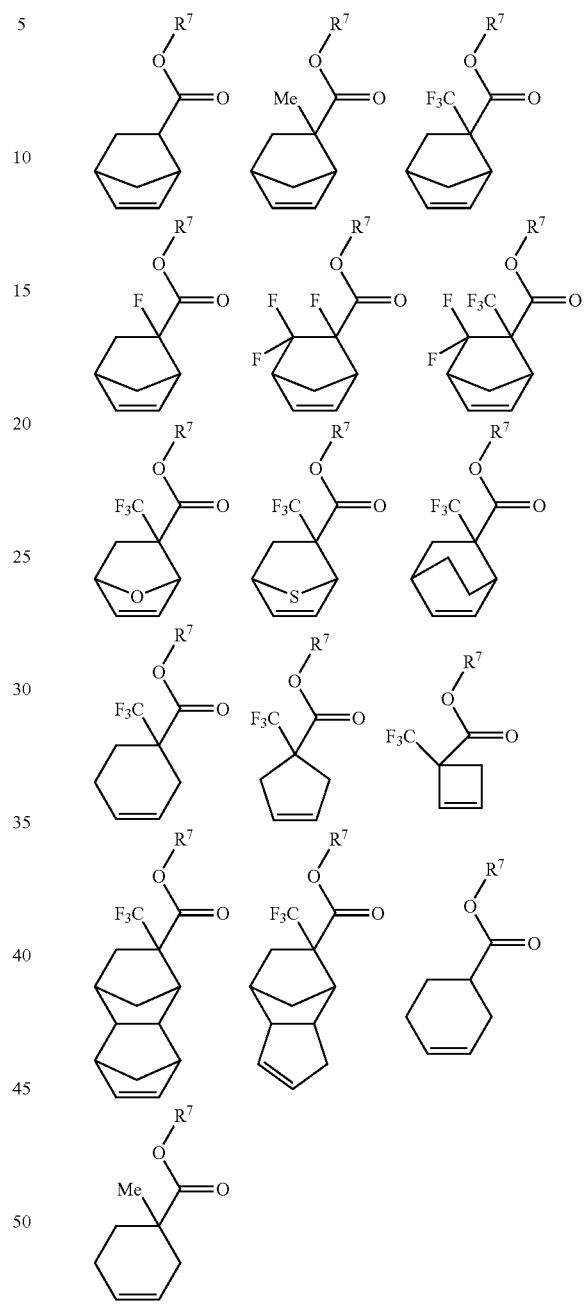

The polymer containing the monomer unit of the formula (1) may be synthesized by copolycondensation through hydrolysis using a silane monomer obtained by the hydrosilylation. Water in hydrolysis may be preferably added in an amount of from 0.2 to 10 moles per mole of the monomer.

Upon this reaction, a catalyst may be used. Examples include acids such as acetic acid, propionic acid, oleic acid, stearic acid, linoleic acid, salicylic acid, benzoic acid, formic acid, oxalic acid, malonic acid, phthalic acid, fumaric acid, citric acid, tartaric acid, hydrochloric acid, sulfuric acid, nitric acid, sulfonic acid, methylsulfonic acid, p-toluenesulfonic acid and trifluoromethanesulfonic acid; bases such as ammonia trimethylamine, triethylamine, triethanolamine, tetramethylammonium hydroxide, tetraethylammonium hydroxide, choline hydroxide, 1,8-diazabicyclo[5.4.0]-7-undecene (DBU), 1,5-diazabicyclo[4.3.0]-5-nonenone (DBN), sodium hydroxide, potassium hydroxide, barium hydroxide and calcium hydroxide; and metal chelate compounds such as tetraalkoxytitanium, trialkoxymono(acetylacetonato)titanium, tetraalkoxyzirconium, and trialkoxymono(acetylacetonato)zirconium.

Hydrolysis reaction may be initiated by dissolving the monomer in an organic solvent and adding water to the solution. The catalyst may be added to water or an organic solvent in advance. The reaction temperature may be from 0 to 100° C., preferably from 10 to 80° C. During dropwise addition of water, the solution may be preferably heated to from 10 to 50° C., followed by maturation at a temperature raised to 40 to 80° C.

As the organic solvent, those insoluble or sparingly soluble in water may be preferred. Preferred examples may include tetrahydrofuran, toluene, hexane, ethyl acetate, cyclohexanone, methyl-2-n-amylketone, propylene glycol monomethyl ether, ethylene glycol monomethyl ether, propylene glycol monomethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate and γ-butyrolactone.

Then, the catalyst may be neutralized and the organic solvent phase may be separated from the reaction mixture, followed by dehydration. Then, a condensation reaction step in the presence of a basic catalyst may follow. More specifically, the solvent may be distilled off from the hydrolysate solution subjected to neutralization and dehydration. Then, to the residue dissolved in a high boiling point solvent or in a solventless manner, a basic catalyst may be followed by maturation under heating. As the high boiling point solvent, aprotic one having a boiling point of 120° C. or greater such as xylene, cumene, tetralin, mesitylene, dimethylformamide, dimethylacetamide, N-methylpyrrolidone or dimethylsulfoxide may be preferred. As the basic catalyst, sodium hydroxide, potassium hydroxide, tetramethylammonium hydroxide, tetraethylammonium hydroxide, choline hydroxide, 1,8-diazabicyclo[5.4.0]-7-undecene (DBU) and 1,5-diazabicyclo[4.3.0]-5-nonene (DBN) may be preferred. High condensation degree can be attained by the addition of the basic catalyst in an amount of 10 mol % or greater relative to the silicon unit (monomer unit). Addition of an excess of the basic catalyst may not be preferred, because it is apt to cause gelation and makes it difficult to remove the catalyst after reaction. The basic catalyst may be therefore added in an amount of from 10 to 60 mol % relative to the monomer unit. The maturation reaction may be preferably effected at a temperature of from 80 to 200° C., more preferably from 100 to 170° C., still more preferably from 120 to 150° C. Too high maturation temperature may presumably cause decomposition of a side chain organic group. When the maturation temperature is lower than the above-described range, on the other hand, condensation may not proceed completely and the intended Tg cannot always be attained. The maturation can be carried out for from 0.5 to 100 hours.

The invention is characterized by copolycondensation of a fluoroalcohol-substituted polycyclic silane compound which may be substituted or copolycondensation of the above-described silane compound with a norbornenecarboxylate pendant silane compound substituted with an acid-labile group.

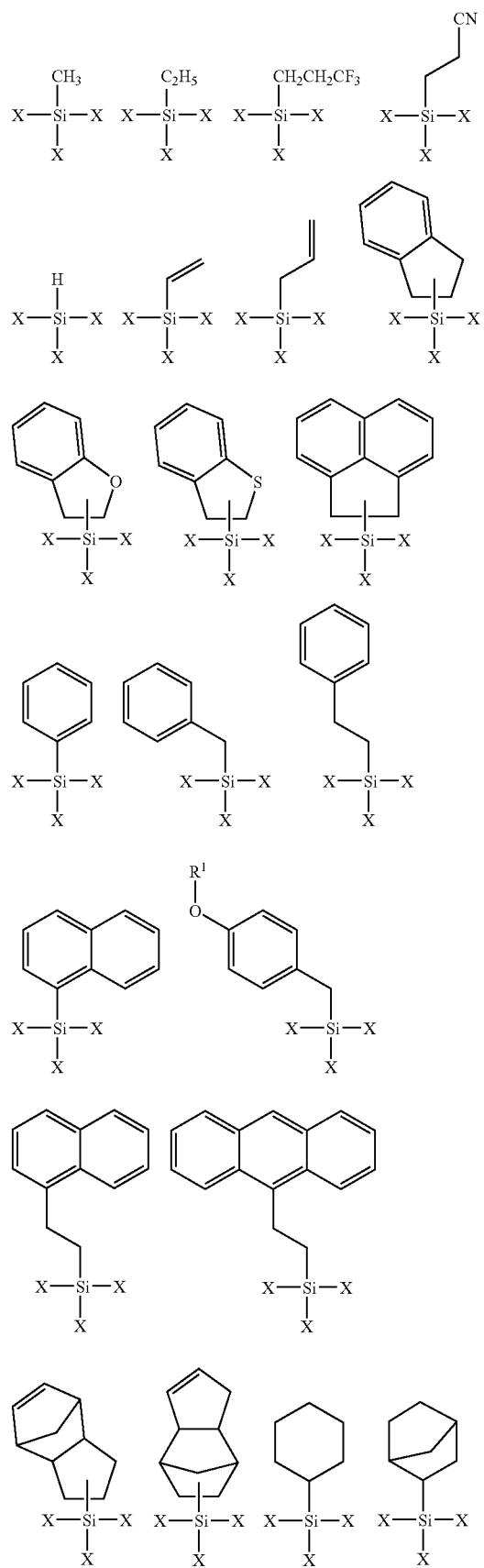

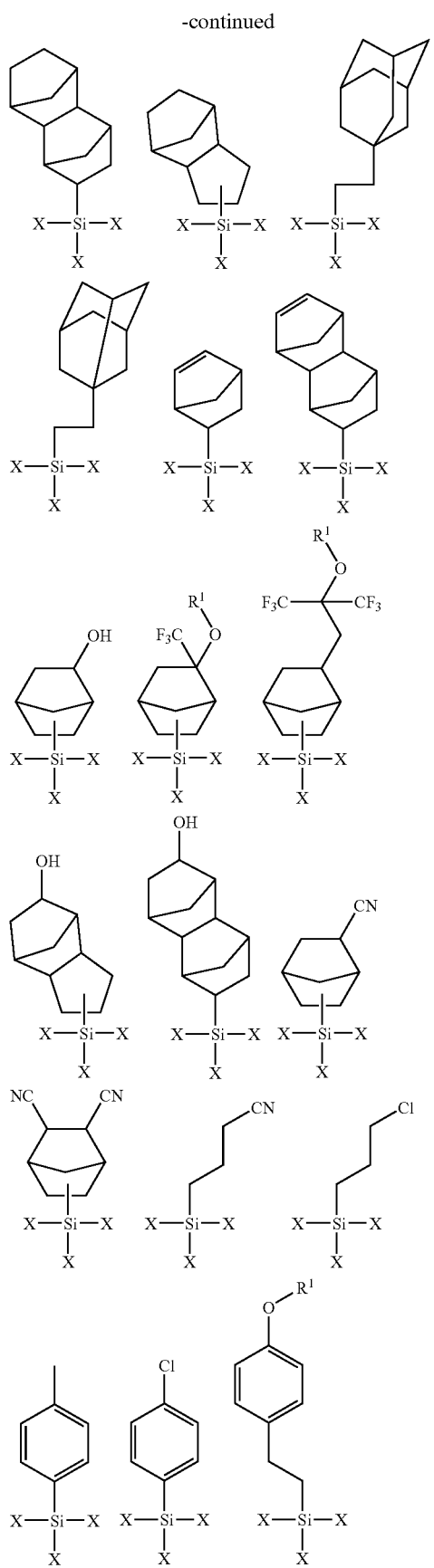

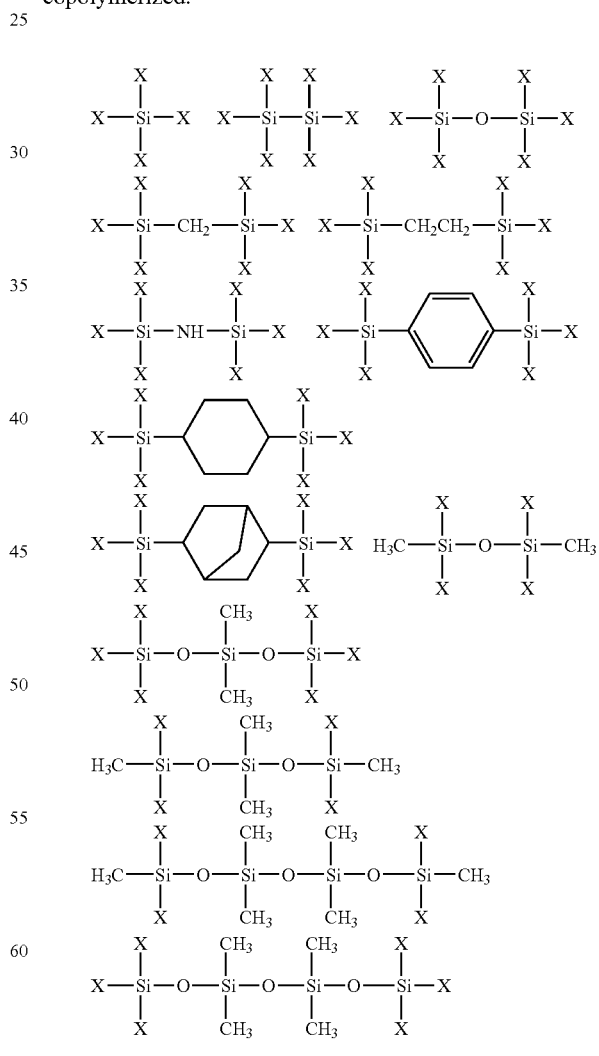

When one of the three Xs is an alkyl or aryl group and the remaining two Xs each represents a hydroxy group, an alkoxy group or a halogen atom, the binding unit obtained by the condensation is a chain siloxane. When three Xs each represents a hydroxy group, an alkoxy group or a halogen atom, the unit available by condensation is siloxane having a ladder skeleton, that is, silsesquioxane.

Silane compounds of the following formula having condensation groups of at least four functional groups can also be copolymerized.

The acid-labile group of the polymer of the invention is $R^7$ in the repeating unit (C) or $R^5$ in the repeating unit (B) in the formula (1) wherein $R^7$ and $R^5$ may be the same or different. It may be represented by the following formulas.

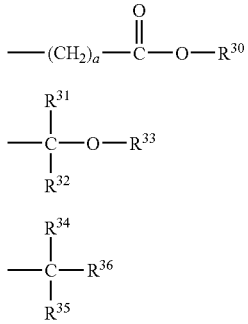

In the formula (A-1), $R^{30}$ represents a $C_{4-20}$, preferably $C_{4-15}$ tertiary alkyl group, a trialkylsilyl group wherein each alkyl group is a $C_{1-6}$ alkyl group, a $C_{4-20}$ oxoalkyl group or a group represented by the above formula (A-3). Specific examples of the tertiary alkyl group may include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl and 2-methyl-2-adamantyl groups. Specific examples of the trialkylsilyl group may include trimethylsilyl, triethylsily and dimethyl-tert-butylsilyl groups. Specific examples of the oxoalkyl group may include 3-oxocyclohexyl, 4-methyl-2-oxooxan-4-yl and 5-methyl-2-oxooxolan-5-yl groups. The letter a stands for an integer of from 0 to 6.

In the formula (A-2), $R^{31}$ and $R^{32}$ each independently represents a hydrogen atom or a linear, branched or cyclic $C_{1-18}$, preferably $C_{1-10}$ alkyl group. Specific examples may include methyl, ethyl, propyl, isopropyl, n-butyl, sec-butyl, tert-butyl, cyclopentyl, cyclohexyl, 2-ethylhexyl and n-octyl groups. $R^{33}$ represents a monovalent $C_{1-18}$, preferably $C_{1-10}$ hydrocarbon group which may have a hetero atom such as an oxygen atom. Examples may include linear, branched or cyclic alkyl groups and these alkyl groups having one or more hydrogen atoms substituted with a hydroxyl, alkoxy, oxo, amino or alkylamino group. Specific examples may include the following substituted alkyl groups.

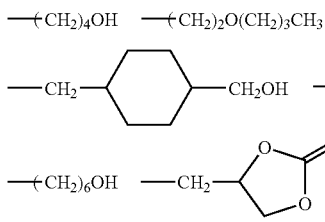

$R^{31}$ and $R^{32}$, $R^{31}$ and $R^{33}$, or $R^{32}$ and $R^{33}$ may be coupled to form a ring. When they form a ring, $R^{31}$, $R^{32}$ and $R^{33}$ each may represent a linear or branched $C_{1-18}$, preferably $C_{1-10}$ alkylene group.

Examples of the acid-labile group represented by the formula (A-1) may include ter-tuboxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl and 2-tetrahydrofuranyloxycarbonylmethyl groups.

Substituents represented by the following formulas (A-1)-1 to (A-1)-9 can also be given as examples.

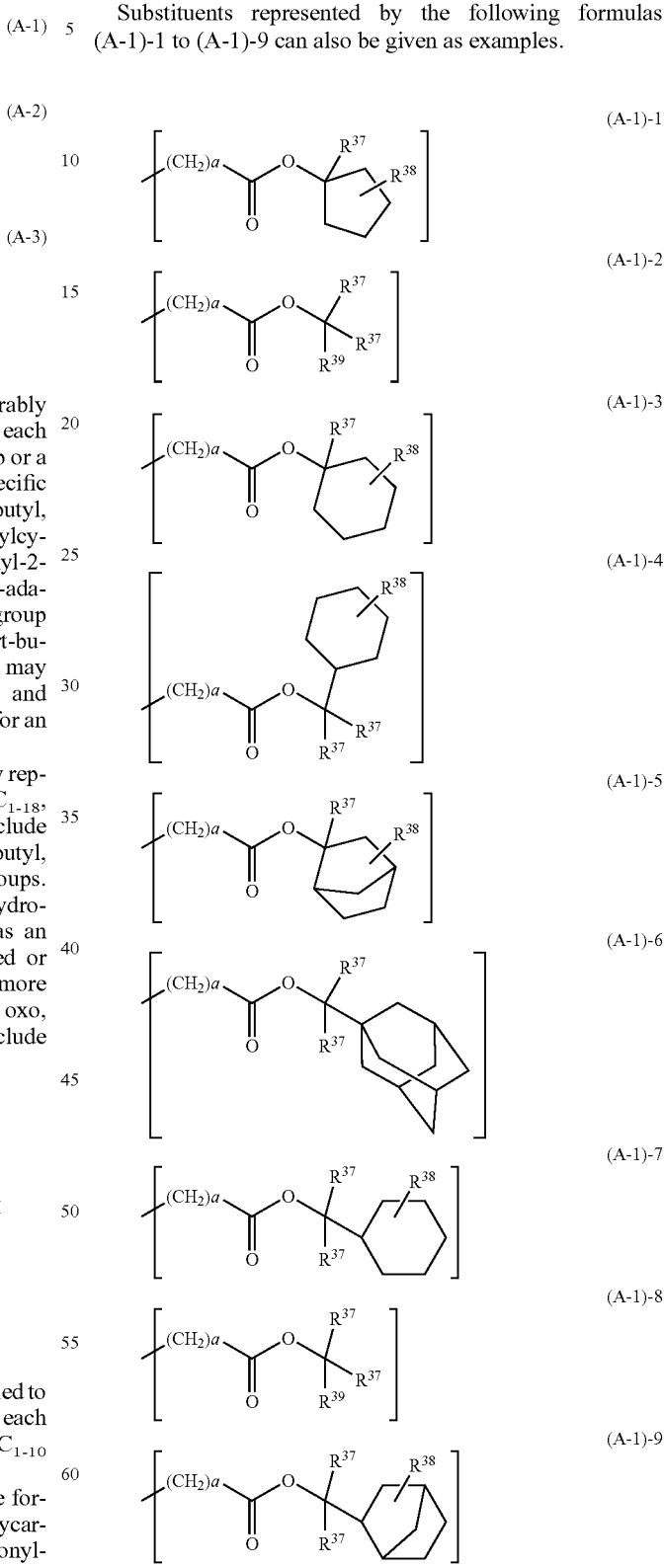

In the above formulas, $R^{37}$s may be the same or different and each-represents a linear, branched or cyclic $C_{1-10}$ alkyl group, or a $C_{6-10}$ aryl group. $R^{39}$ represents a hydrogen atom or a linear, branched or cyclic $C_{1-10}$ alkyl group. $R^{39}$s may be the same or different and each represents a linear, branched or cyclic $C_{2-10}$ alkyl group or a $C_{6-20}$ aryl group.

Of the acid-labile groups represented by the above formula (A-2), linear or branched ones may be, for example, those represented by the following formulas (A-2)-1 to (A-2)-23.

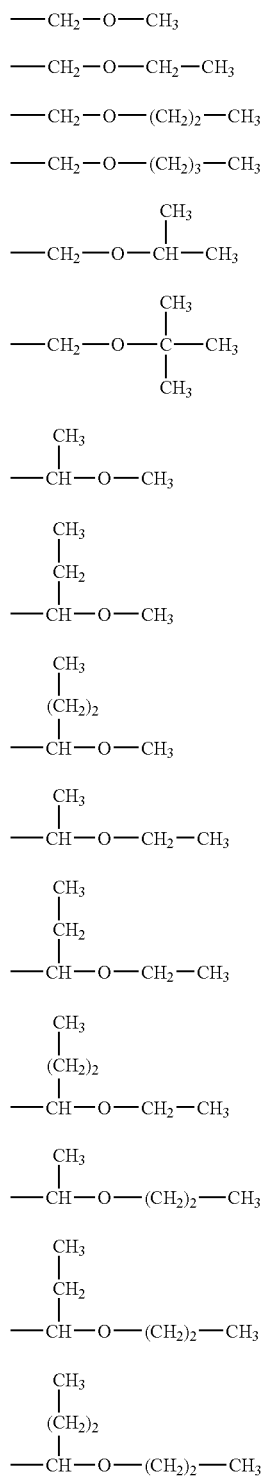

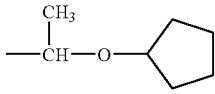
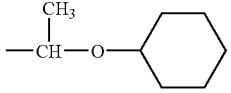
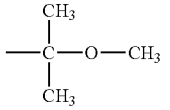
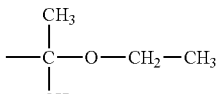
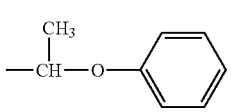
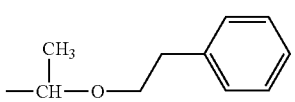

Of the acid-labile groups represented by the above formula (A-2), examples of the cyclic ones may include tetrahydrofuran-2-yl, 2-methyltetrahydrofuran-2-yl, tetrahydropyran-2-yl and 2-methyltetrahydropyran-2-yl groups.

The base resin may be intermolecularly or intramolecularly crosslinked by the acid-labile group represented by the formula (A-2a) or (A-2b).

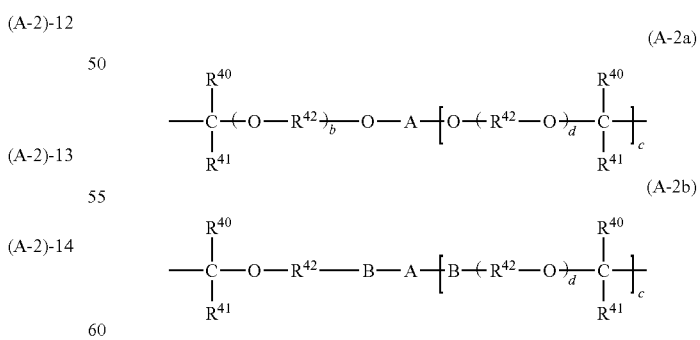

In the above formulas, $R^{40}$ and $R^{41}$ each independently represents a hydrogen atom or a linear, branched or cyclic $C_{1-8}$ alkyl group. $R^{40}$ and $R^{41}$ may be coupled together to form a ring. When they form a ring, $R^{40}$ and $R^{41}$ each represents a linear or branched $C_{1-8}$ alkylene group. $R^{42}$ represents a linear, branched or cyclic $C_{1-10}$ alkylene group. The letters b and d each independently stands for 0 or an integer from 1 to 10, preferably 0 or an integer of from 1 to 5; and the letter c stands for an integer of from 1 to 7. A represents a (c+1)-valent aliphatic or alicyclic saturated hydrocarbon, aromatic hydrocarbon, or heterocyclic group having 1 to 50 carbon atoms. These groups may have a hetero atom interposed therein or some hydrogen atoms, which have been attached to their carbon atom, may be substituted with a hydroxyl group, carboxyl group, carbonyl group or fluorine atom. B stands for —CO—O—, —NHCO—O—, or —NHCONH—.

In this case, it is preferred that A represents a divalent to tetravalent linear, branched or cyclic $C_{1-20}$ alkylene, alkyltriyl or alkyltetrayl group or $C_{6-30}$ arylene group. These groups may have a heteroatom interposed therein or some hydrogen atoms, which have been attached to their carbon atom, may be substituted with a hydroxyl group, carboxyl group, acyl group or halogen atom. The letter c preferably stands for an integer of from 1 to 3.

Specific examples of the crosslinked type acetal group represented by the formula (A-2a) or (A-2b) may include those represented by the following formulas (A-2)-24 to (A-2)-31.

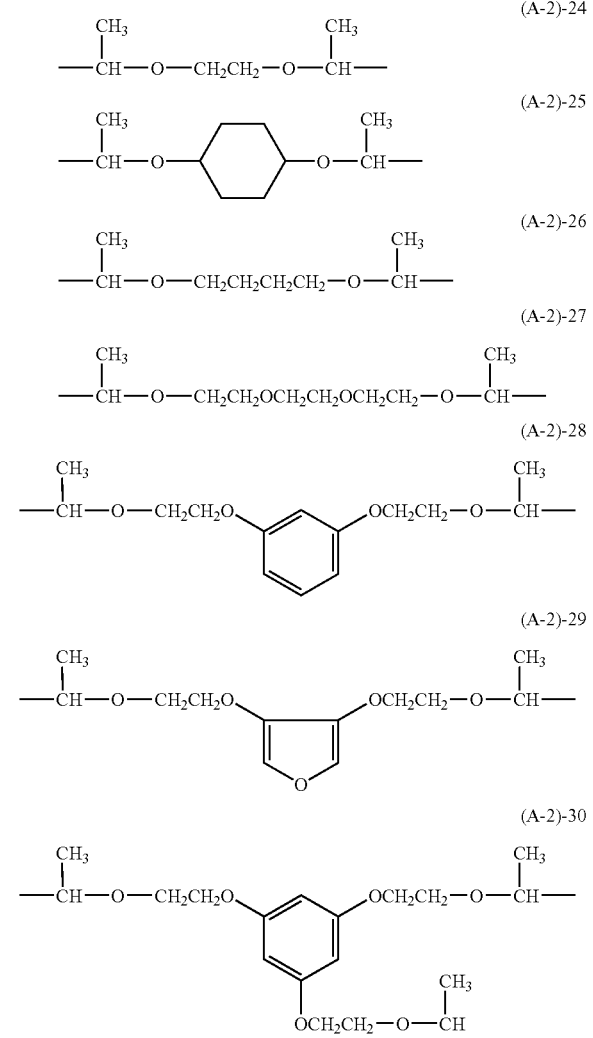

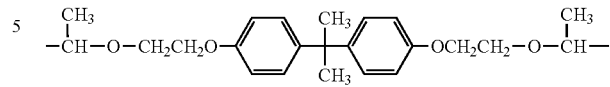

In the formula (A-3), $R^{34}$, $R^{35}$ and $R^{36}$ each independently represents a monovalent hydrocarbon group such as linear, branched or cyclic $C_{1-20}$ alkyl groups. They may contain a hetero atom such as oxygen, sulfur, nitrogen or fluorine. $R^{34}$ and $R^{35}$, $R^{34}$ and $R^{36}$, or $R^{35}$ and $R^{36}$ may be coupled together to form, with the carbon atom to which they are attached, a $C_{3-20}$ ring.

Examples of the tertiary alkyl group represented by the formula (A-3) may include tert-butyl, triethylcarbyl, 1-ethylnorbonyl, 1-methylcyclohexyl, 1-ethylcyclopentyl, 2-(2-methyl)adamantyl, 2-(2-ethyl)adamantyl and tert-amyl groups.

The tertiary alkyl groups represented by the following formulas (A-3)-1 to (A-3)-18 can also be given as specific examples.

-continued (A-3)-7

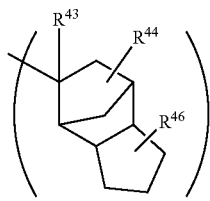

(A-3)-8

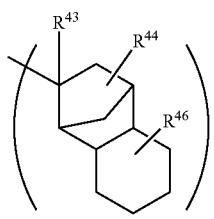

(A-3)-9

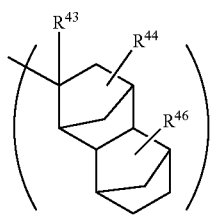

(A-3)-10

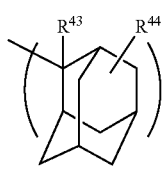

(A-3)-11

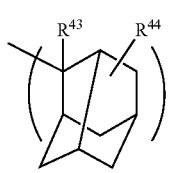

(A-3)-12

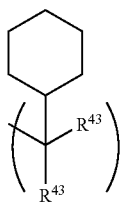

(A-3)-13

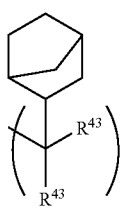

-continued (A-3)-14

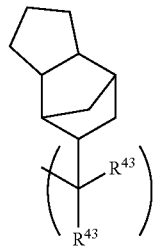

(A-3)-15

(A-3)-16

(A-3)-17

(A-3)-18

In the formulas (A-3)-1 to (A-3)-18, $R^{43}$s may be the same or different and each represents a linear, branched or cyclic $C_{1-8}$ alkyl group or a $C_{6-20}$ aryl group such as phenyl. $R^{44}$ and $R^{46}$ each independently represents a hydrogen atom or a linear, branched or cyclic $C_{1-20}$ alkyl group. $R^{45}$ represents a $C_{6-20}$ aryl group such as phenyl.

As shown in the formulas (A-3)-19 to (A-3)-20, the polymer may be intermolecularly or intramolecularly crosslinked while containing $R^{47}$ representing an alkylene or arylene group having a valence of two or greater. In the formulas (A-3)-19 and (A-3)-20; $R^{43}$ has the same meaning as described above and $R^{47}$ represents a linear, branched or cyclic $C_{1-20}$ alkylene group or an arylene group such as phenylene and may contain a hetero atom such as oxygen, sulfur or nitrogen atom. The letter b1 stands for an integer of from 1 to 3.

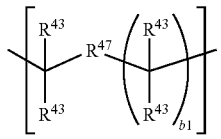
(A-3)-19

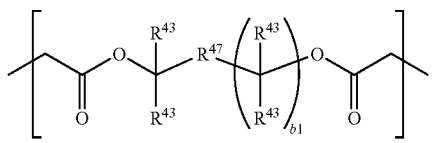
(A-3)-20

$R^{34}$, $R^{35}$ and $R^{36}$ in the formula (A-3) may have a hetero atom such as oxygen, nitrogen or sulfur and specific examples may include those represented by the formulas (A)-1 to (A)-7.

Examples of $R^{30}$, $R^{33}$ and $R^{36}$ in the formulas (A-1), (A-2) and (A-3), respectively may include substituted or unsubstituted aryl groups such as phenyl, p-methylphenyl, p-ethylphenyl, and alkoxy-substituted phenyl such as p-methoxylphenyl; aralkyl groups such as benzyl and phenethyl; and the foregoing groups which contain an oxygen atom or the foregoing groups in which a hydrogen atom attached to a carbon atom is substituted with a hydroxyl group or two hydrogen atoms are substituted with an oxygen atom to form a carbonyl group, i.e., alkyl and oxoalkyl groups as shown below.

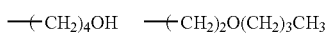

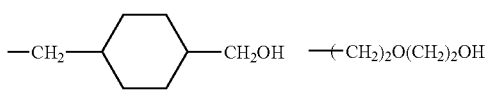

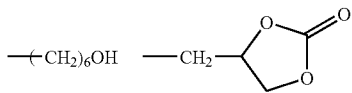

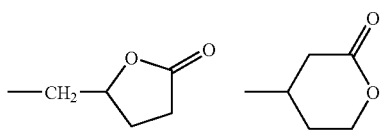

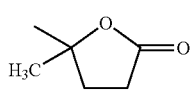

Examples of the trialkylsilyl group wherein each alkyl group is a $C_{1-6}$ alkyl group, the trialkylsilyl group being used as the acid-labile group, may include trimethylsilyl, triethylsilyl and tert-butyldimethylsilyl groups.

The following silicon-containing acid-labile groups can also be used.

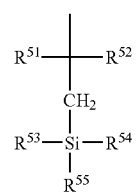
(A-4)

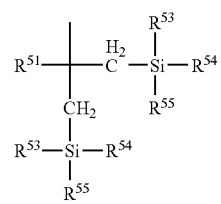
(A-5)

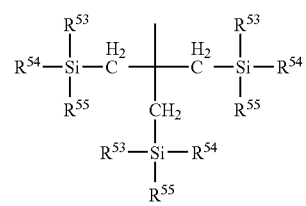
(A-6)

In the above formulas, $R^{51}$ and $R^{52}$ each independently represents a hydrogen atom or a $C_{1-20}$ alkyl group, and $R^{53}$, $R^{54}$ and $R^{55}$ may be the same or different and each represents a $C_{1-20}$ alkyl or haloalkyl group, a $C_{6-20}$ aryl group or a silicon-containing group attached to an intramolecular silicon atom via a siloxane bond or silmethylene bond. $R^{51}$ and $R^{52}$ may be coupled to form a ring.

The followings may be specific examples of (A-4), (A-5) and (A-6).

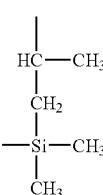
(A-4)-1

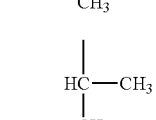
(A-4)-2

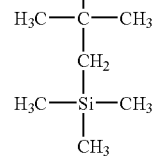
(A-4)-3

-continued (A-4)-4 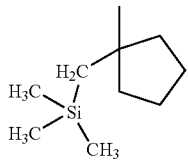

(A-4)-5 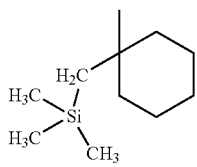

(A-4)-6 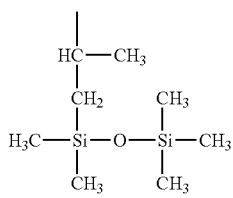

(A-4)-7 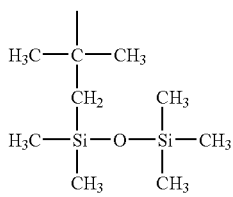

(A-4)-8 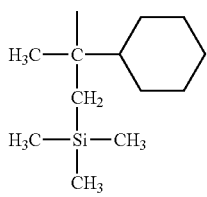

(A-4)-9 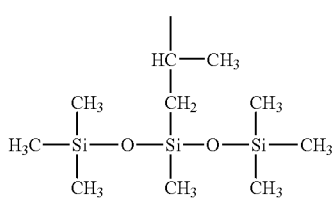

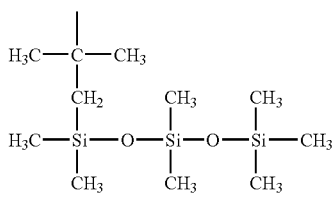

-continued (A-5)-2 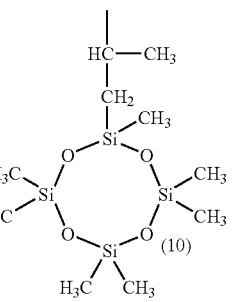

(A-5)-3 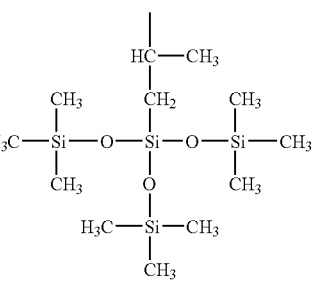

Examples of the $C_{1-6}$ trialkylsilyl group as the acid-labile group of the polymer of the present invention may include trimethylsilyl, triethylsilyl and dimethyl-tert-butylsilyl groups.

The polymer of the invention may be copolymerized with another composition. Since it has the repeating unit a, b or c within the above-described range, it displays effects of heightening dissolution contrast, resolution properties and adhesion to substrate and improving resistance to line edge roughness.

The polymers of the invention each may preferably have a weight-average molecular weight (Mw) of from 500 to 500,000, preferably from 1,000 to 30,000. When the weight-average molecular weight is too small, the resist material may be inferior in heat resistance or Tg. When it is too large, alkali solubility may lower, which may promote the formation of a skirt shape after pattern formation. The weight-average molecular weight is determined by gel permeation chromatography (GPC) based on polystyrene.

The polymer of the present invention has a glass transition temperature (Tg) of 100° C. or greater. The Tg can be measured by DSC (differential scanning calorimeter).

When the polymer of the present invention represented by the formula (1) has a wide molecular weight distribution (Mw/Mn, wherein Mn:number-average molecular weight) owing to the existence of low molecular weight and high molecular weight polymers, foreign matters may exist on the pattern or deterioration in the pattern profile may occur after exposure. The influence of the molecular weight or molecular weight distribution tends to increase as the pattern rule becomes finer. In order to obtain a resist material suited for fine pattern size, the multicomponent copolymer used therefor preferably has a narrow molecular weight distribution of from 1.0 to 2.0, especially preferably from 1.0 to 1.5.

It is also possible to use a mixture of two or more polymers different in composition ratio, molecular weight distribution or molecular weight. The present invention is characterized by at least the use of a polysilsesquioxane represented by the formula (1) and having a substituted or unsubstituted hydroxyindane as a pendant group. However, it may contain another component in order to improve adhesion, dry etching resistance and transparency.

The additional component does not necessarily contain silicon. Examples of such a component may include (meth) acrylic derivatives, styrene derivatives, hydroxystyrene derivatives, vinylsilane derivatives, allylsilane derivatives, benzofuran, indole, benzothiophene, methyleneindane, norbornene derivatives, acenaphthene derivatives, vinylnaphthalene derivatives, vinylanthracene derivatives, vinyl acetate, (meth)acrylonitrile, vinylpyrrolidone, dihydropyran, vinyl ether derivatives, norbornene, norbornadiene, methylene norbornene, propylene and isopropylene.

When condensation is effected using a silane compound which has, as a pendant, indane having a hydroxy group substituted with an acetyl or pivaloyl group, the acetyl group or pivaloyl group must be converted into hydroxy group by alkaline hydrolysis.

As a base for alkaline hydrolysis, aqueous ammonia, triethylamine or the like can be used. The reaction temperature is preferably from −20 to 100° C., more preferably from 0 to 60° C. The reaction time is preferably from 0.2 to 100 hours, more preferably from 0.5 to 20 hours. After condensation, the resulting polymer may be subjected to alkaline hydrolysis, or polymerization and hydrolysis can be carried out simultaneously because the condensation of an alkoxysilane proceeds by an alkaline catalyst.

The acid-labile group may be introduced into the hydroxyl group moiety, for example, by reacting the phenolic hydroxyl group of the polymer with an alkenyl ether compound in the presence of an acid catalyst.

As the reaction solvent, aprotic polar solvent such as dimethylformamide, dimethylacetamide, tetrahydrofuran and ethyl acetate may be preferred. They may be used either singly or in combination of two or more thereof. Preferred examples of the acid as the catalyst may include hydrochloric acid, sulfuric acid, trifluoromethanesulfonic acid, p-toluenesulfonic acid, methanesulfonic acid, pyridinium p-toluenesulfonate. The amount thereof may be preferably such that the hydrogen atom of the phenolic hydroxyl group of the polymer to be reacted is from 0.1 to 10 mole % per mole of the entire hydroxyl groups. The reaction temperature may be preferably from −20 to 100° C., more preferably from 0 to 60° C. and the reaction time may be preferably from 0.2 to 100 hours, more preferably from 0.5 to 20 hours.

A polymer having a phenolic hydroxyl group partially protected with an alkoxyalkyl group can be obtained by reacting a halogenated alkyl ether compound with a polymer in the presence of a base.

Preferred reaction solvent may be aprotic polar solvents, including acetonitrile, acetone, dimethylformamide, dimethylacetamide, tetrahydrofuran and dimethylsulfoxide. It may be used singly or in combination of two or more thereof. As the base, triethylamine, pyridine, diisopropylamine, potassium carbonate and the like may be preferred. And the amount thereof may be preferably such that the hydrogen atom of the phenolic hydroxyl group of the polymer to be reacted is 10 mole % or greater per mole of the entire hydroxyl groups. The reaction temperature may be preferably from −50 to 100° C., more preferably from 0 to 60° C. and the reaction time may be preferably from 0.5 to 100 hours, more preferably from 1 to 20 hours.

The acid-labile group of formula (A-1) can be introduced by reacting a dialkyl dicarbonate compound or alkoxycarbonylalkyl halide with the polymer in a solvent in the presence of a base.

Preferred reaction solvent may be aprotic polar solvent, including acetonitrile, acetone, dimethylformamide, dimethylacetamide, tetrahydrofuran and dimethylsulfoxide. It may be used singly or in combination as a mixture of two or more thereof.

As the base, triethylamine, pyridine, imidazole, diisopropylamine and potassium carbonate may be preferred. The amount thereof may be preferably such that the hydrogen atom of the phenolic hydroxyl group of the starting polymer to be reacted is 10 mole % or greater per mole of the entire hydroxyl groups.

The reaction temperature may be preferably from 0° C. to 100° C., more preferably from 0° C. to 60° C. The reaction time may be preferably from about 0.2 to 100 hours, more preferably for from 1 to 10 hours.

The dialkyl dicarbonate compound may include di-tert-butyl dicarbonate and di-tert-amyl dicarbonate.

The alkoxycarbonylalkyl halide may include tert-butoxycarbonylmethyl chloride, tert-amyloxycarbonylmethyl chloride, tert-butoxycarbonylmethyl bromide and tert-butoxycarbonylethyl chloride.

It is noted that the synthesis method is not limited to the above-described ones.

The positive resist material of the invention may comprise an organic solvent, or a compound (acid generator) which generates an acid upon exposure to high energy radiation. The resist material may optionally comprise a dissolution inhibitor, a basic compound, a compound having in the molecule thereof a group represented by ≡C—COOH, a surfactant or another component.

Any organic solvent can be used for the positive resist material of the invention, particularly chemically amplified positive resist material insofar as it can dissolve therein the base resin, acid generator and the other additives. Examples of such an organic solvent may include, but not limited to, ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate and propylene glycol mono-tert-butyl ether acetate; and lactones such as γ-butyrolactone.

The organic solvent may be used singly or in combination of two or more thereof. Of the organic solvent, diethylene glycol dimethyl ether, 1-ethoxy-2-propanol and propylene glycol monomethyl ether acetate, and mixtures thereof may be preferably used, because it excels in solubility of the resist component of acid generator.

The organic solvent may be suitably added in an amount of from 200 to 5,000 parts by weight, especially from 400 to 2,000 parts by weight based on 100 parts by weight of the base resin.

Examples of the acid generator to be used in the invention may include:
(i) onium salt represented by the formula (P1a-1), (P1a-2) or (P1b),
(ii) diazomethane derivative represented by the formula (P2),
(iii) glyoxime derivative represented by the formula (P3),
(iv) bissulfone derivative represented by the formula (P4),
(v) sulfonate ester of an N-hydroxyimide compound represented by the formula (P5), (vi) β-ketosulfonic acid derivative,
(vii) disulfone derivative,
(viii) nitrobenzylsulfonate derivative, and
(ix) sulfonate derivative.

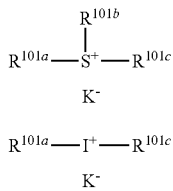

P1a-1

P1a-2 wherein $R^{101a}$, $R^{101b}$, and $R^{101c}$ each independently represents a linear, branched or cyclic $C_{1-12}$ alkyl, alkenyl, oxoalkyl or oxoalkenyl group, a $C_{6-20}$ aryl group, or $C_{7-12}$ aralkyl or aryloxoalkyl group, with the proviso that the hydrogen atoms of these groups may be partially or entirely substituted by an alkoxy group; or $R^{101b}$ and $R^{101c}$ may form a ring and when they form a ring, $R^{101b}$ and $R^{101c}$ each represents a $C_{1-6}$ alkylene group; and $K^-$ represents a non-nucleophilic counterion.

$R^{101a}$, $R^{101b}$, and $R^{101c}$ may be the same or different and each represents a linear, branched or cyclic $C_{1-12}$ alkyl group. Specific examples may include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl.

Examples of the linear, branched or cyclic $C_{1-12}$ alkenyl group represented by $R^{110a}$, $R^{101b}$, and $R^{101c}$ may include vinyl, allyl, propenyl, butenyl, hexenyl and cyclohexenyl.

Examples of linear, branched or cyclic $C_{1-12}$ oxoalkyl group represented by $R^{101a}$, $R^{101b}$, and $R^{101c}$ may include 2-oxocyclopentyl and 2-oxocyclohexyl as well as 2-oxopropyl, 2-cyclopentyl-2-oxoethyl, 2-cyclohexyl-2-oxoethyl and 2-(4-methylcyclohexyl)-2-oxoethyl.

Examples of the $C_{6-20}$ aryl group represented by $R^{101a}$, $R^{101b}$ and $R^{101c}$ may include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl.

Examples of the $C_{7-12}$ aralkyl group represented by $R^{101a}$, $R^{101b}$ and $R^{101c}$ may include benzyl, phenylethyl, and phenethyl.

Examples of the $C_{7-12}$ aryloxoalkyl group represented by $R^{101a}$, $R^{101b}$ and $R^{101c}$ may include 2-aryl-2-oxoethyl groups such as 2-phenyl-2-oxoethyl, 2-(1-naphthyl)-2-oxoethyl and 2-(2-naphthyl)-2-oxoethyl.

Examples of the non-nucleophilic counterion represented of $R^{101a}$, $R^{101b}$, and $R^{101c}$ as $K^-$ may include halide ions such as chloride and bromide ions; fluoroalkylsulfonates such as triflate, 1,1,1-trifluoroethanesulfonate and nonafluorobutanesulfonate; arylsulfonates such as tosylate, benzenesulfonate, 4-fluorobenzenesulfonate and 1,2,3,4,5-pentafluorobenzenesulfonate; and alkylsulfonates such as mesylate and butanesulfonate.

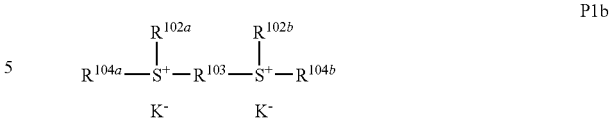

P1b wherein $R^{102a}$ and $R^{102b}$ each independently represents a linear, branched or cyclic $C_{1-8}$ alkyl group; $R^{103}$ represents a linear, branched or cyclic $C_{1-10}$ alkylene group; $R^{104a}$ and $R^{104b}$ each independently represent a $C_{3-7}$ 2-oxoalkyl group; and $K^-$ represents a non-nucleophilic counterion.

Specific examples of $R^{102a}$ and $R^{102b}$ may include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl.

Examples of $R^{103}$ may include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene and 1,4-cyclohexanedimethylene.

Examples of $R^{104a}$ and $R^{104b}$ may include 2-oxopropyl, 2-oxocyclopentyl, 2-oxocyclohexyl and 2-oxocycloheptyl.

The $K^-$ may include counterions similar to those described in the formulas (P1a-1) and (P1a-2).

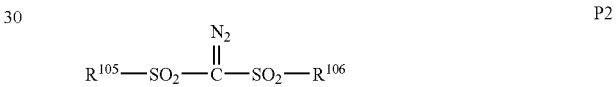

P2 wherein $R^{105}$ and $R^{106}$ each independently represents a linear, branched or cyclic $C_{1-12}$ alkyl or halogenated alkyl group, $C_{6-20}$ aryl or halogenated aryl group or $C_{7-12}$ aralkyl group.

Examples of the linear, branched or cyclic $C_{1-12}$ alkyl group represented by $R^{105}$ and $R^{106}$ may include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl and adamantyl.

Examples of the linear, branched or cyclic $C_{1-12}$ halogenated alkyl groups may include trifluoromethyl, 1,1,1-trifluoroethyl, 1,1,1-trichloroethyl and nonafluorobutyl.

Examples of the $C_{6-20}$ aryl groups represented by $R^{105}$ and $R^{106}$ may include a phenyl group, alkoxyphenyl groups such as p-methoxyphenyl, m-methoxyphenyl, o-methoxyphenyl, ethoxyphenyl, p-tert-butoxyphenyl and m-tert-butoxyphenyl, and alkylphenyl groups such as 2-methylphenyl, 3-methylphenyl, 4-methylphenyl, ethylphenyl, 4-tert-butylphenyl, 4-butylphenyl and dimethylphenyl.

Examples of the $C_{6-20}$ halogenated aryl groups represented by $R^{105}$ and $R^{106}$ may include fluorophenyl, chlorophenyl and 1,2,3,4,5-pentafluorophenyl.

Examples of the $C_{7-12}$ aralkyl groups represented by represented by $R^{105}$ and $R^{106}$ may include benzyl and phenethyl.

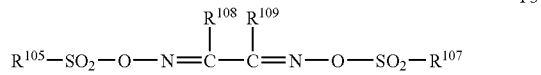

P3 wherein $R^{107}$, $R^{108}$, and $R^{109}$ each independently represents a linear, branched or cyclic $C_{1-12}$ alkyl or halogenated alkyl group, a $C_{6-20}$ aryl or halogenated aryl group, or a $C_{7-12}$ aralkyl group; or $R^{108}$ and $R^{109}$ may be coupled together to form a cyclic structure and when $R^{106}$ and $R^{109}$ form a cyclic structure, they each represents a linear or branched $C_{1-6}$ alkylene group.

Examples of the alkyl, halogenated alkyl, aryl, halogenated-aryl, and aralkyl groups represented by $R^{107}$, $R^{108}$, and $R^{109}$ may be the same as those described in $R^{105}$ and $R^{106}$. Examples of the alkylene group represented by $R^{108}$ and $R^{109}$ may include methylene, ethylene, propylene, butylene, and hexylene.

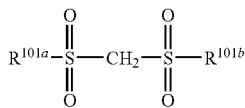

P4 wherein $R^{101a}$ and $R^{101b}$ have the same meanings as described above.

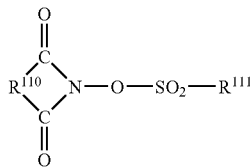

P5 wherein $R^{110}$ is a $C_{6-10}$ arylene group, a $C_{1-6}$ alkylene group, or a $C_{2-6}$ alkenylene group, with the proviso that the hydrogen atoms of these groups may be partially or entirely replaced by a linear or branched $C_{1-4}$ alkyl or alkoxy group, nitro, acetyl, or phenyl group; and $R^{111}$ is a linear, branched or substituted $C_{1-8}$ alkyl, alkenyl or alkoxyalkyl group, a phenyl group or a naphthyl group. In $R^{111}$, the hydrogen atoms of these groups may be partially or entirely replaced by a $C_{1-4}$ alkyl or alkoxy group; a phenyl group which may be substituted by a $C_{1-4}$ alkyl, $C_{1-4}$ alkoxy, nitro or acetyl group; a $C_{3-5}$ hetero-aromatic group; a chlorine atom; or a fluorine atom.

Examples of the $C_{6-10}$ arylene group represented by $R^{110}$ may include 1,2-phenylene and 1,8-naphthylene; those of the $C_{1-6}$ alkylene group may include methylene, ethylene, trimethylene, tetramethylene, phenylethylene and norbornane-2,3-diyl; and those of the $C_{2-6}$ alkenylene group may include 1,2-vinylene, 1-phenyl-1,2-vinylene and 5-norbornene-2,3-diyl.

The examples of the linear, branched or cyclic $C_{1-8}$ alkyl group represented by $R^{111}$ may be similar to those described for $R^{101a}$ to $R^{101c}$. Examples of the linear, branched or substituted $C_{1-8}$ alkenyl group may include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and examples of the linear, branched or substituted $C_{1-8}$ alkoxyalkyl group may include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl and methoxyheptyl.

Of the substituents on these groups, examples of the $C_{1-4}$ alkyl group may include methyl, ethyl, propyl, isopropyl, n-butyl, isobutyl and tert-butyl; those of the $C_{1-4}$ alkoxy group include methoxy, ethoxy, propoxy, isopropoxy, n-butoxy, isobutoxy and tert-butoxy.

Examples of the phenyl group which may be substituted by a $C_{1-4}$ alkyl, $C_{1-4}$ alkoxy, nitro or acetyl group may include phenyl, tolyl, p-tert-butoxyphenyl, p-acetylphenyl and p-nitrophenyl, and those of the $C_{3-5}$ hetero-aromatic group may include pyridyl and furyl.

Specific examples of the onium salt may include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate] and 1,2'-naphthylcarbonylmethyltetrahydrothiophenium triflate.

Examples of the diazomethane derivative may include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl)diazomethane.

Examples of the glyoxime derivative may include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1-trifluoroethanesulfonyl)-α-dimethylglyoxime, bis-o-(tert-butanesulfonyl)-α-dimethylglyoxime, bis-O-(perfluorooctanesulfonyl)-α-dimethylglyoxime, bis-O-

(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime and bis-O-(camphorsulfonyl)-α-dimethylglyoxime.

Examples of the bissulfone derivative may include bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane and bisbenzenesulfonylmethane.

Examples of the β-ketosulfone derivative may include 2-cyclohexylcarbonyl-2-(p-toluenesulfonyl)propane and 2-isopropylcarbonyl-2-(p-toluenesulfonyl)propane.

Examples of the nitrobenzyl sulfonate derivative may include 2,6-dinitrobenzyl p-toluenesulfonate and 2,4-dinitrobenzyl p-toluenesulfonate.

Examples of the sulfonate ester derivative may include 1,2,3-tris(methanesulfonyloxy)benzene, 1,2,3-tris(trifluoromethanesulfonyloxy)benzene and 1,2,3-tris(p-toluenesulfonyloxy)benzene.

Examples of the sulfonate ester of a N-hydroxyimide compound may include N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethahesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate and N-hydroxy-5-norbornene-2,3-dicarboxyimide p-toluenesulfonate.

Of these, preferred may be onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate and 1,2'-naphthylcarbonylmethyltetrahydrothiophenium triflate; diazomethane derivative such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane and bis(tert-butylsulfonyl)diazomethane; glyoxime derivativessuch as bis-O-(p-toluenesulfonyl)-α-dimethylglyoxime and bis-O-(n-butanesulfonyl)-α-dimethylglyoxime; bissulfone derivative such as bisnaphthylsulfonylmethane; and sulfonate ester of a N-hydroxyimide compound such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

The acid generator may be used singly or in combination of two or more thereof. Since the onium salt has excellent effects for improving rectangularity and the diazomethane derivative and the glyoxime derivative have excellent effects for reducing standing waves, fine adjustment of the profile can be carried out by using them in combination.

The acid generator may be added in an amount of from 0.1 to 50 parts by weight, especially from 0.5 to 40 parts by weight, based on 100 parts by weight of the base resin. When the amount is less than 0.1 part by weight, the resulting resist material may have poor sensitivity and resolution owing to a small generation amount of an acid upon exposure. When the amount exceeds 50 parts by weight, on the other hand, transmittance of the resist may lower, leading to poor resolution.

The resist composition of the invention may comprise a basic compound.

As the basic compound, those capable of suppressing a diffusion rate of an acid generated by the acid generator upon diffusion in the resist film may be suited. The incorporation of the basic compound may suppress the acid diffusion rate in the resist film, resulting in improvement in resolution, suppression of changes in sensitivity after exposure, reduction in dependence on substrate or environment, and improvement in the exposure latitude or pattern profile.

Examples of such a basic compound may include primary, secondary and tertiary aliphatic amines, mixed amines, aromatic amines, heterocyclic amines, carboxy-containing nitrogenous compounds, sulfonyl-containing nitrogenous compounds, hydroxyl-containing nitrogenous compounds, hydroxyphenyl-containing nitrogenous compounds, alcoholic nitrogenous compounds, amide derivatives, and imide derivatives.

Specific examples of the primary aliphatic amine may include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine and tetraethylenepentamine.

Examples of the secondary aliphatic amine may include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine and N,N-dimethyltetraethylenepentamine.

Examples of the tertiary aliphatic amine may include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of mixed amine may include dimethylethylamine, methylethylpropylamine, benzylamine, phenethylamine and benzyldimethylamine.

Specific examples of aromatic and heterocyclic amines may include aniline derivatives (such as aniline, N-methylaniline, N-ethylaniline, N-propylaniline, N,N-dimethylaniline, 2-methylaniline, 3-m-ethylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine), diphenyl(p-tolyl)amine, methyldiphenylamine, triphenylamine, phenylenediamine, naphthylamine, diaminonaphthalene, pyrrole derivatives (such as pyrrole, 2H-pyrrole, 1-methylpyrrole, 2,4-dimethylpyrrole, 2,5-dimethylpyrrole and N-methylpyrrole), oxazole derivatives (such as oxazole and isooxazole), thiazole derivatives (such as thiazole and isothiazole), imidazole derivatives (such as imidazole, 4-methylimidazole, and 4-methyl-2-phenylimidazole), pyrazole derivatives, furazan derivatives, pyrroline derivatives (such as pyrroline and 2-methyl-1-pyrroline), pyrrolidine derivatives (such as pyrrolidine, N-methylpyrrolidine, pyrrolidinone and N-methylpyrrolidone), imidazoline derivatives, imidazolidine derivatives, pyridine derivatives (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (such as quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives.

Examples of the carboxyl-containing nitrogenous compound may include aminobenzoic acid, indolecarboxylic acid, and amino acid derivatives (such as nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of the sulfonyl-containing nitrogenous compound may include 3-pyridinesulfonic acid and pyridinium p-toluenesulfonate. Examples of the hydroxyl-containing nitrogenous compound, hydroxyphenyl-containing nitrogenous compound, and alcoholic nitrogenous compound may include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-peperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)-isonicotinamide. Examples of the amide derivative may include formamide, N-methylformamide, N,N-dimethylformamide, acetamide, N-methylacetamide, N,N-dimethylacetamide, propionamide and benzamide. Examples of the imide derivative may include phthalimide, succinimide and maleimide.

In addition, one or more basic compounds selected from the compounds represented by the following general formula (B1) may also be comprised.

$$N(X)_n(Y)_{3-n} \quad \text{(B)-1}$$

In the formula, n stands for 1, 2 or 3; the side chain Xs may be the same or different and can be represented by the following formulas (X)-1 to (X)-3; the side chain Ys may be the same or different, each represents a hydrogen atom or a linear, branched or cyclic $C_{1-20}$ alkyl group, and may contain an ether group or a hydroxyl group; or two or more Xs may be coupled together to form a ring.

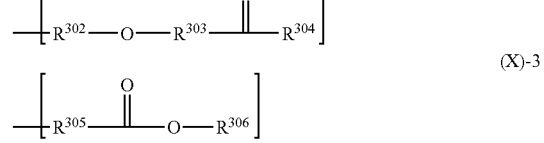

In the formulas, $R^{300}$, $R^{302}$ and $R^{305}$ each independently represents a linear or branched $C_{1-4}$ alkylene group; $R^{301}$ and $R^{304}$ each independently represents a hydrogen atom or a linear, branched or cyclic $C_{1-20}$ alkyl group and may contain at least one hydroxyl group, ether group, ester group or lactone ring; $R^{303}$ represents a single bond or a linear or branched $C_{1-4}$ alkylene group; and $R^{306}$ represents a linear, branched or cyclic $C_{1-20}$ alkyl group and may contain at least one hydroxy group, ether, ester group or lactone ring.

The compound represented by the formula (B)-1 will next be described specifically.

Examples thereof may include, but not limited to, tris(2-methoxymethoxyethyl)amine, tris{2-(2-methoxyethoxy)ethyl}amine, tris{2-(2-methoxyethoxy-methoxy)ethyl}amine, tris{2-(1-methoxyethoxy)ethyl}amine, tris{2-(1-ethoxyethoxy)ethyl}amine, tris{2-(1-ethoxy-propoxy)ethyl}amine, tris[2-{2-(2-hydroxyethoxy)ethoxy}-ethyl]amine, 4,7,13,16,21,24-hexaoxa-1,10-diazabicyclo-[8.8.8]hexacosane, 4,7,13,18-tetraoxa-1,10-diazabicyclo-[8.5.5]eicosane, 1,4,10,13-tetraoxa-7,16-diazabicyclooctadecane, 1-aza-12-crown-4,1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)

ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl 2-[(methoxycarbonyl)methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl)2-(tetrahydrofurfuryloxycarbonyl)-ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl] ethylamine, N,N-bis(2-acetoxyethyl)2-[(2-oxotetrahydrofuran-3-yl)oxycarbonyl]ethylamine, N,N-bis (2-hydroxyethyl)2-(4-hydroxybutoxycarbonyl)ethylamine, N,N-bis(2-formyloxyethyl)2-(4-formyloxybutoxycarbonyl) ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2--(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis [2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl) amine, tris(ethoxycarbonylmethyl)amine, N-butylbis (methoxycarbonylmethyl)amine, N-hexylbis (methoxycarbonylmethyl)amine and β-(diethylamino)-δ-valerolactone.

In addition, one or more basic compounds having a cyclic structure represented by the following formula (B)-2 can also be comprised.

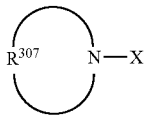

(B)-2

(wherein X has the same meaning as described above and $R^{307}$ represents a linear or branched $C_{2-20}$ alkylene group and may contain one or more carbonyl, ether, ester or sulfide groups.

Specific examples of the B-2 may include 1-[2-(methoxymethoxy)ethyl]pyrrolidine, 1-[2-(methoxymethoxy) ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy) ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate and 2-methoxyethyl morpholinoacetate.

Also, cyano-containing basic compound represented by the following formulas (B)-3 to (B)-6 can be comprised.

(B)-3

(B)-4

(B)-5

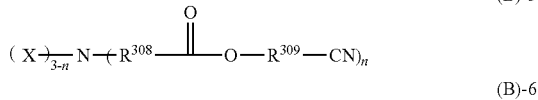

(B)-6

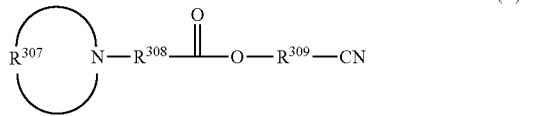

(wherein X, $R^{307}$ and n have the same meanings as described above, and $R^{308}$ and $R^{309}$ may be the same or different and each represents a linear or branched $C_{1-4}$ alkylene group.

Specific examples of the cyano-containing base may include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropionitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopripionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate and 2-cyanoethyl 4-morpholinepropionate.

The basic compound of the present invention may be preferably added in an amount of from 0.001 to 2 parts by weight, especially preferably from 0.01 to 1 part by weight based on 100 parts by weight of the entire base resin. When the amount is less than 0.001 part by weight, it may not be sufficient enough to provide any desired effect. Amounts exceeding 2 parts by weight, on the other hand, may result in excessive lowering in sensitivity.

The dissolution inhibitor may be preferably a compound having a weight average molecular weight of from 100 to 1,000 and obtained by substituting 10 to 100 mol % on average of the hydrogen atoms of the phenolic hydroxyl group of the compound having, in the molecule thereof, at least two phenolic hydroxyl groups with an acid-labile group.

Examples of such a dissolution inhibitor preferably employed in the invention may include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenylmethane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxypropyloxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane and 1,1,2-tris(4'-(1'-ethoxypropyloxy)phenyl)ethane.

The above-described compound may have a weight-average molecular weight of from 100 to 1,000, preferably from 150 to 800. The dissolution inhibitor may be comprised in an amount of from 0 to 50 parts by weight, more preferably from 5 to 50 parts by weight, still more preferably from 10 to 30 parts by weight based on 100 parts by weight of the base resin. They may be used singly or in combination of two or more thereof. Amounts less than the above-described range may not be effective for improving resolution. Amounts greater than the above-described range, on the other hand, may cause a film thickness decrease of the pattern, leading to lowering in resolution.

As the compound having in the molecule thereof a group represented by $\equiv$C—COOH, one or more compounds selected from Groups I and II below can be used. However, it is to be understood that the present invention is not limited thereto. Incorporation of this component improves the PED stability of the resist and ameliorates edge roughness on a nitride film substrate.

[Group I]

Compounds which are obtained by partially or entirely substituting the hydrogen atoms on the phenolic hydroxyl groups of each of the compounds represented by the following formulas (A1) to (A10) with —$R^{401}$—COOH (wherein $R^{401}$ represents a linear or branched $C_{1-10}$ alkylene group), and in which the molar ratio C/(C+D) (C: amount of the phenolic hydroxyl group, and D: amount of $\equiv$C—COOH group) in the molecule is from 0.1 to 1.0.

[Group II]

Compounds represented by the below-described formulas (A11) to (A-15).

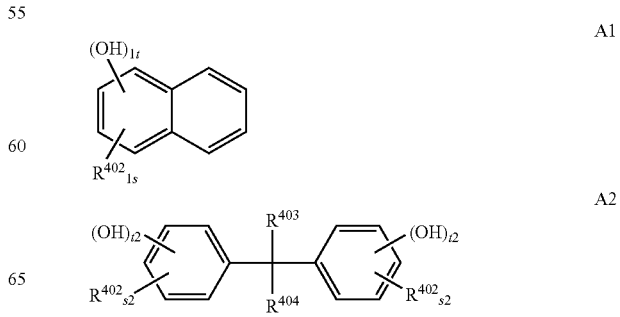

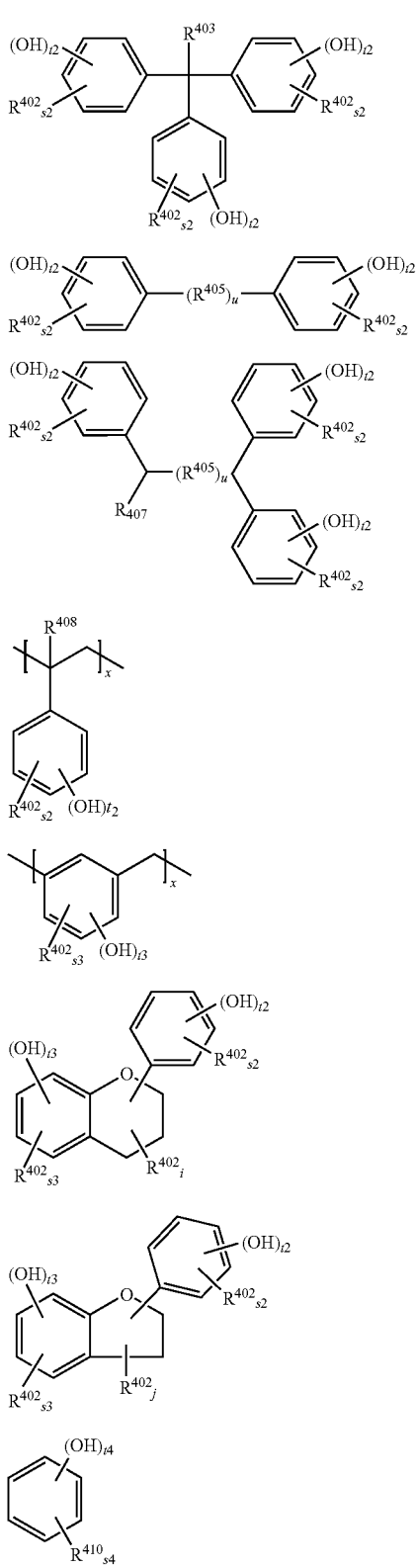

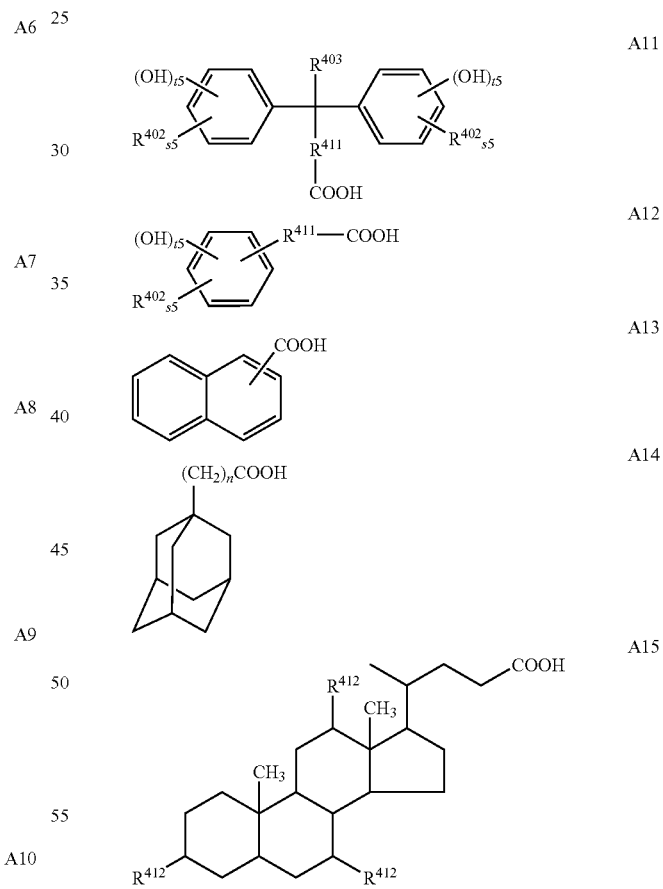

wherein $R^{402}$ and $R^{403}$ each independently represents a hydrogen atom or a linear or branched $C_{1-8}$ alkyl or alkenyl group; $R^{404}$ represents a hydrogen atom, a linear or branched $C_{1-8}$ alkyl or alkenyl group, or a —$(R^{409})_h$—COOR' group (R' representing a hydrogen atom or —$R^{409}$—COOH); $R^{405}$ represents —$(CH_2)_i$— (i standing for an integer of from 2 to 10), a $C_{6-10}$ arylene group, a carbonyl group, a sulfonyl group, an oxygen atom, or a sulfur atom; $R^{406}$ represents a $C_{1-10}$ alkylene group, a $C_{6-10}$ arylene group, a carbonyl group, a sulfonyl group, an oxygen atom, or a sulfur atom; $R^{407}$ represents a hydrogen atom, a linear or branched $C_{1-8}$ alkyl or alkenyl group, or a hydroxyl-substituted phenyl or naphthyl group; $R^{408}$ represents a hydrogen atom or a methyl group; $R^{409}$ represents a linear or branched $C_{1-10}$ alkyl or alkenyl group, or a —$R^{411}$—COOH group; $R^{410}$ represents a hydrogen atom, a linear or branched $C_{1-8}$ alkyl or alkenyl group, or a —$R^{411}$—COOH group; $R^{411}$ represents a linear or branched $C_{1-10}$ alkylene group; j stands for an integer from 0 to 3; s1 to s4 and t1 to t4 each satisfies s1+t1=8, s2+t2=5, s3+t3=4, and s4+t4=6, and are such that each phenyl skeleton has at least one hydroxyl group; κ is a number such that the compound of formula (A6) may have a weight-average molecular weight of from 1,000 to 5,000; and λ is a number such that the compound of formula (A7) may have a weight-average molecular weight of from 1,000 to 10,000.

wherein $R^{402}$, $R^{403}$, and $R^{411}$ have the same meanings as described above; $R^{412}$ represents a hydrogen atom or a hydroxyl group; s5 and t5 are numbers which satisfy s5≧0, t5≧0, and s5+t5=5; and h' stands for 0 or 1.

As this component, compounds represented by the below-described formulas AI-1 to 14 and AII-1 to 10 can be given as specific examples, but are not limited thereto.

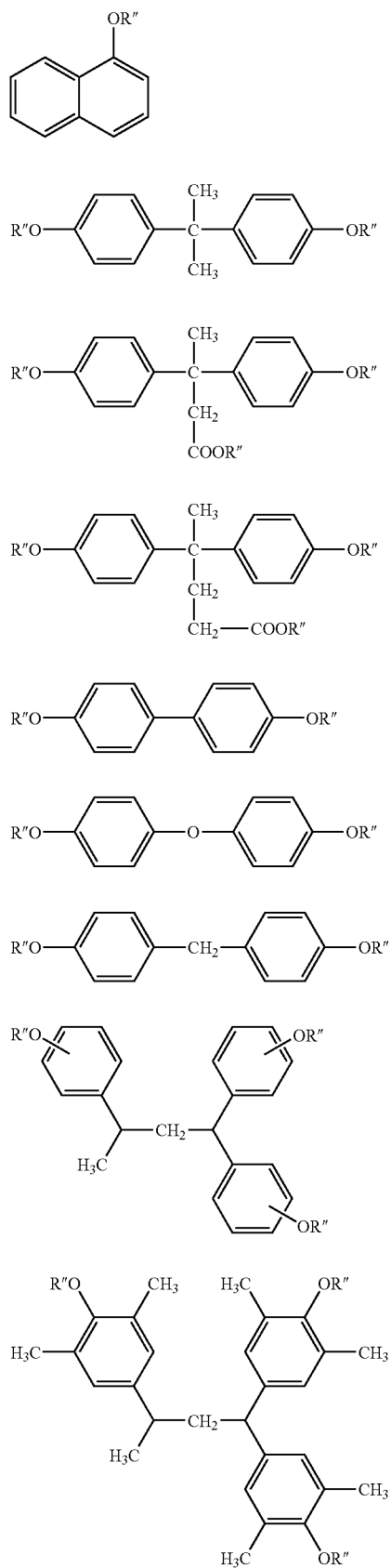

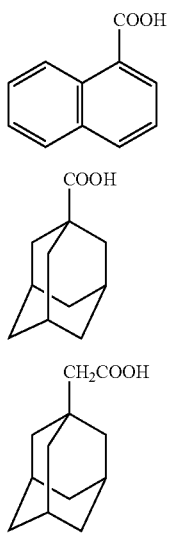

AII-9

AII-8

AII-9

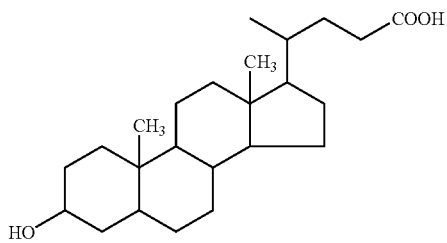

AII-10 wherein R" represents a hydrogen atom or a CH$_2$COOH group, with the proviso that 10 to 100 mol % of R" in each compound represents a CH$_2$COOH group, and α and κ have the same meanings as described above.

The compound having in the molecule thereof a group represented by the formula: ≡C—COOH may be comprised preferably in an amount of from 0 to 5 parts by weight, more preferably from 0.1 to 5 parts by weight, still more preferably from 0.1 to 3 parts by weight, still more preferably from 0.1 to 2 parts based on the amount of base resin. Amount exceeding 5 parts by weight may lower the resolution of the resist material.

No particular limitation is imposed on the surfactant to be comprised by the resist material of the invention. Examples may include nonionic surfactants, for example, polyoxyethylene alkyl ethers such as polyoxyethylene lauryl ether, polyethylene stearyl ether, polyoxyethylene cetyl ether and polyoxyethylene oleyl ether; polyoxyethylene alkyl allyl ethers such as polyoxyethylene octyl phenol ether and polyoxyethylene nonyl phenol; polyoxyethylene polyoxypropylene block copolymers; sorbitan fatty acid esters such as sorbitan monolaurate, sorbitan monopalmitate and sorbitan monostearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as "EFTOP EF301, EF303 and EF352" (each, trade name; products of Tohkem Products Co., Ltd.), "Megaface F171, F172 and F173" (each, trade name; product of Dainippon Ink & Chemicals, Inc.), "Florade FC430, FC431, and FC4430" (each, trade name; product of Sumitomo 3M Co., Ltd.), "Asahiguard AG710", "Surflon S-381, S-382, SC101, SC102, SC103, SC104, SC105, and SC106", and "Surfynol E1004, KH-10, KH-20, KH-30 and KH-40" (each, trade name; product of Asahi Glass Co., Ltd.); organosiloxane polymers "KP-341, X-70-092 and X-70-093" (trade name; product of Shin-Etsu Chemical Co., Ltd.); and acrylic acid or methacrylic acid "Polyflow No. 75 and No. 95" (each, trade name; product of Kyoeisha Yushi Kagaku Kogyo Co., Ltd.). Of these, "FC430", "FC-4430", "Surflon S-381", and "Surfynol E1004, KH-20, KH-30, KP-341, X-70-092, X-70-093" may be preferred. These surfactants may be used singly or in combination of two or more thereof.

For the pattern formation using the resist material of the invention, known lithographic technique can be adopted. For example, the resist material may be applied onto a substrate such as silicon wafer to give a film thickness of from 0.1 to 1.0 μm by spin coating or the like, followed by prebaking on a hot plate preferably at 60 to 200° C. for 10 seconds to 10 minutes, more preferably at 80 to 150° C. for 30 seconds to 5 minutes. With a mask having a desired pattern placed above the resist film, the resist film may be then exposed to high-energy radiation having a wavelength not greater than 300 nm, such as deep-UV rays, an excimer laser, or x-rays preferably in a dose of about 1 to 200 mJ/cm$^2$, more preferably about 10 to 100 mJ/cm$^2$. The film may be then subjected to post-exposure bake (PEB) on a hot plate preferably at 60 to 150° C. for 10 seconds to 5 minutes, more preferably at 80 to 130° C. for 30 seconds to 3 minutes. Then, with a 0.1 to 5 wt %, more preferably 2 to 3 wt % aqueous solution of tetramethylammonium hydroxide (TMAH) as a developer, the film may be developed in a conventional manner such as dipping, puddling or spraying preferably for 10 seconds to 3 minutes, more preferably for 0.5 to 2 minutes, whereby the desired pattern may be formed on the substrate. Of the various types of high-energy radiation, the resist material of the invention may be best suited to micropattern formation with, in particular, deep-UV rays having a wavelength of 254 to 120 nm, an excimer laser, especially ArF excimer laser having a wavelength of 193 nm, F$_2$ excimer laser having a wavelength of 157 nm, Kr$_2$ excimer laser having a wavelength of 146 nm, KrAr excimer laser having a wavelength of 134 nm or Ar$_2$ excimer laser having a wavelength of 126 nm, EUV having a frequency of 13 nm or 8 nm, x-rays, or an electron beam. The desired pattern may not be made outside the upper and lower limits of the above range.

The present invention provides a pattern formation method on a substrate by lithography, more specifically, a pattern formation method on a substrate by forming an organic film on a substrate, applying the photoresist film material of the invention on the organic film, prebaking to form a photoresist film, exposing the pattern circuit region of the photoresist film to high energy radiation or electron beam having a wavelength not greater than 300 nm, developing with a developer to form a resist pattern on the photoresist film, etching the organic film with the photoresist film having the resist pattern formed therein as a mask, and etching the substrate to form the pattern on the substrate.

This pattern formation method will next be described referring to FIG. 1.

FIG. 1 schematically illustrates the method of forming a silicon-containing resist pattern by exposure, PEB and development, forming an underlying organic film pattern by oxygen gas etching and then dry etching a film to be methoded.

First, the steps up to the formation of a resist pattern as illustrated in FIG. 1(a) are described.

An organic film 23 is formed on a substrate 22 by spin coating or the like. This organic film 23 serves as a mask for etching of the substrate 22 so that it preferably has high etching resistance. A photoresist film 21 is formed on this organic film 23 preferably by spin coating. The photoresist-film material applied by spin coating is then prebaked under conditions similar to those described above. Then, a pattern circuit region is exposed, followed by post exposure bake (PEB) and development with a developer, whereby a resist pattern is formed (FIG. 1(a)).

Examples of the organic film may include novolac type resins such as cresol novolac, naphthol novolac, phenol dicyclopentadiene novolac, and resins such as amorphous carbon, polyhydroxystyrene, acrylate, methacrylate, polyimide and polysulfone.

Figure 1B:
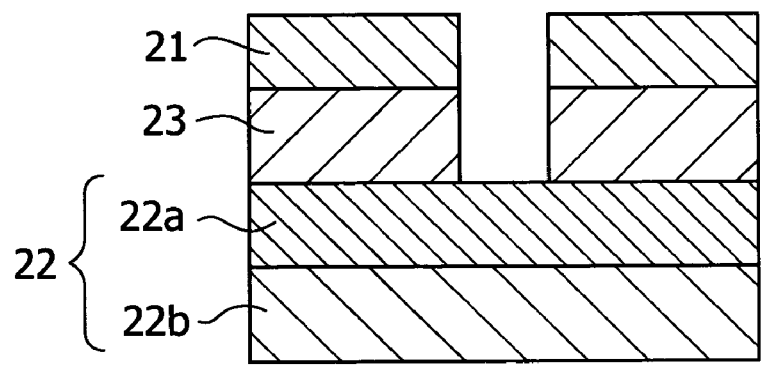

As illustrated in FIG. 1(b), with the photoresist film 21 having the pattern formed therein as a mask, the organic film 23 is then dry etched (preferably with an oxygen gas) to transfer the resist pattern to the organic film 23.

Oxygen gas etching is reactive plasma etching with an oxygen gas as a main component and it permits etching of an underlying organic film at a high aspect ratio. In addition to an oxygen gas, another gas for protecting side walls such as CO, $CO_2$, $SO_2$, $N_2$, $NH_3$, NO or $NO_2$ gas may be added in order to prevent the formation of a T-top shape due to overetching.

Etching with a chlorofluorocarbon gas for short hours can be conducted prior to oxygen gas etching for the purpose of removing the scum from the resist after development, smoothening its line edge and thereby preventing roughness on the line edge.

Figure 1C:
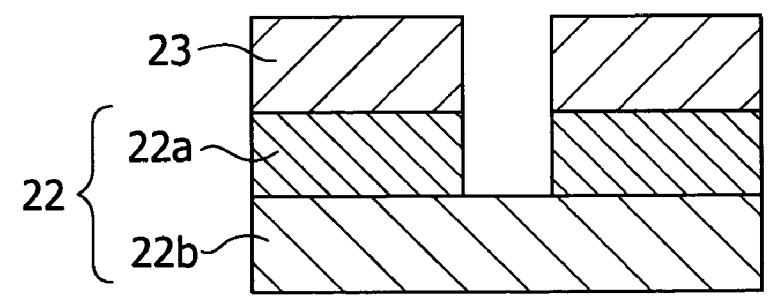

As illustrated in FIG. 1(c), with the pattern of the organic film 23 as a mask, a layer to be processed 22a over the underlying layer 22b is then dry etched to form a pattern on the substrate 22. The subsequent etching of the substrate 12 may be carried out with a gas mainly comprising a chlorofluorocarbon gas when the layer 12a over the underlying layer 12b is made of $SiO_2$ or $Si_3N_4$. Examples of the chlorofluorocarbon gas may include $CF_4$, $CHF_3$, $CF_2F_2$, $C_2F_6$, $C_3F_8$, $C_4F_{10}$, and $C_5F_{12}$. Dry etching of the film to be processed and peeling of the silicon-containing resist film can be carried out simultaneously. When the film to be processed is of polysilicon, tungsten silicide or TiN/Al, the film is etched with a gas mainly comprising chlorine or bromine.

With regards to the film or layer thickness, the organic film 23 may have a thickness of from 50 to 2000 nm and the resist film may have a thickness of from 0.1 to 1.0 pm (preferably, from 100 to 500 nm). However, it is to be noted that the thickness is not limited to the above-described range.

The silicon-containing resist of the invention exhibits excellent resistance against etching with a gas mainly comprising halogen (chlorine, bromine, etc.) and may be processed in the same manner as that for monolayer resist.

Figure 2A:
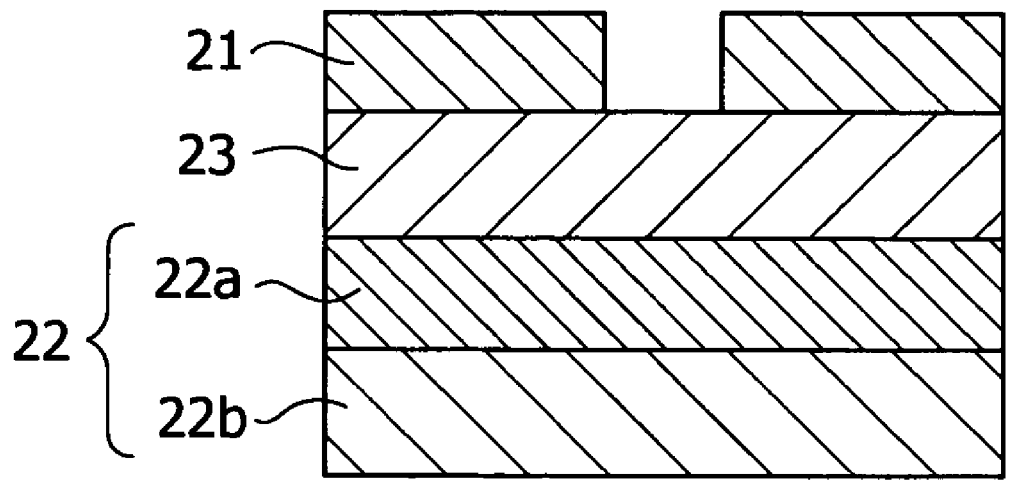
FIG. 2 illustrates another example of the pattern formation method of the present invention, in which (a) resist pattern after development, and (b) pattern after dry etching with a halogen gas are shown.
Figure 2B:
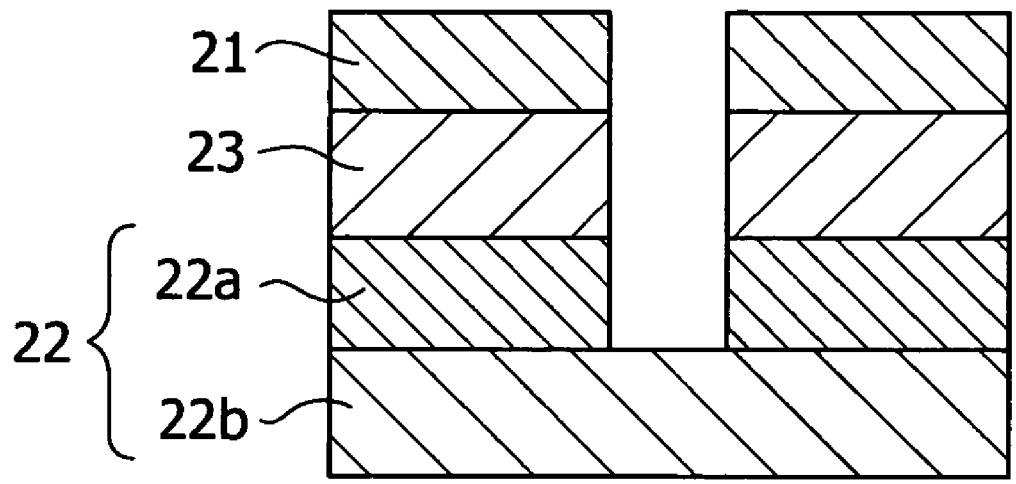

For example, as illustrated in FIG. 2, an organic film and the silicon-containing resist film of the invention may be successively formed directly on a layer to be processed, followed by pattern exposure and alkali development to form a resist pattern. FIG. 2(a) illustrates a resist pattern after development. The layer to be processed can then be etched with a gas mainly comprising chlorine or bromine. FIG. 2(b) illustrates a pattern after dry etching with a halogen gas. With the resist pattern as a mask, a pattern can be formed in the layer to be processed.

The present invention will next be described in detail by Synthesis Examples, Comparative Synthesis Examples, Examples and Comparative Examples. However, it should not be construed that the present invention is limited to them.

SYNTHESIS EXAMPLE 1

In 150 g of tetrahydrofuran and 30 g of pure water were dissolved 19.0 g of 2-carbo-t-butoxy-5(6)-trimethoxysilyl-norbornane, 45.3 g of 2-carbomethoxy-5(6)-trimethoxysilyl-norbornane and 29.7 g of 2-(2,2-bistrifluoromethyl-2-hydroxyethyl)-5(6)-trimethoxysilylnorbornane. After the temperature of the resulting solution was elevated to 35° C., 0.7 g of oxalic acid was added dropwise. The reaction mixture was stirred for 10 hours, whereby a siloxane hydrolysate was obtained. The resulting hydrolysate had a weight-average molecular weight of 1100. After neutralization with aqueous ammonia, washing with water was repeated, whereby a neutral hydrolysate solution was obtained. Under reduced pressure, tetrahydrofuran and dissolved water were removed to yield 73 g of the hydrolysate as a solid. The resulting solid is designated as Hydrolysate-1.

SYNTHESIS EXAMPLE 2

Hydrolysate-1 was dissolved in 40 g of dimethylformamide. To the resulting solution was added 5 g of potassium hydroxide, followed by heating at 140° C. for 16 hours. The reaction mixture was dissolved in 1000 ml of ethyl acetate. The resulting solution was neutralized with acetic acid and then washing with 500 ml of pure water was repeated, whereby a neutral condensate solution was obtained. From the resulting solution, ethyl acetate and dissolved water were removed under reduced pressure to yield 70 g of the condensate as a solid. The condensate had a weight-average molecular weight of 2700 and Tg of 110° C. It was confirmed that a T1/T2/T3 ratio of this condensate as measured by $^{29}$SiNMR was 0/8/92 and a ratio of T3 reached at least 90% of the whole condensate. The resulting solid is designated as Condensate-1.

SYNTHESIS EXAMPLE 3

Hydrolysate-1 was dissolved in 40 g of dimethylformamide. To the resulting solution was added 1.7 g of potassium hydroxide, followed by heating at 140° C. for 16 hours. The reaction mixture was dissolved in 1000 ml of ethyl acetate. The resulting solution was neutralized with acetic acid and then washing with 500 ml of pure water was repeated, whereby a neutral condensate solution was obtained. From the resulting solution, ethyl acetate and dissolved water were removed under reduced pressure to yield 70 g of the condensate as a solid. The condensate had a weight-average molecular weight of 2750 and Tg of 105° C. It was confirmed that a T1/T2/T3 ratio of this condensate as measured by $^{29}$SiNMR was 0/12/88 and a ratio of T3 reached about 90% of the whole condensate. The resulting solid is designated as Condensate-2.

COMPARATIVE SYNTHESIS EXAMPLE 1

Hydrolysate-1 was dissolved in 230 ml of methyl isobutyl ketone. To the resulting solution were added 30 g of pure water and 45 g of triethylamine and they were reacted at 60° C. for 5 hours. To the reaction mixture was added 1000 ml of ethyl acetate. The resulting mixture was neutralized with acetic acid and then washing with 500 ml of pure water was repeated, whereby a neutral condensate solution was obtained. From the resulting solution, ethyl acetate and dissolved water were removed under reduced pressure to yield 70 g of the condensate as a solid. The condensate had a weight-average molecular weight of 2100 and Tg of 70° C. It was confirmed that a T1/T2/T3 ratio of this condensate as measured by $^{29}$SiNMR was 0/47/53 and a ratio of T3 was only about 50% of the whole condensate.

EVALUATION EXAMPLE

A solution obtained using the polymer synthesized above and formulated in accordance with Table 1 was filtered through a 0.2 pm filter, whereby a positive resist material was prepared.

TABLE 1

| Condensate | Transmittance (%) at 248 nm | Transmittance (%) at 193 nm | Transmittance (%) at 157 nm |
|---|---|---|---|
| Condensate-1 | 93 | 91 | 70 |
| Condensate-2 | 95 | 93 | 77 |
| Comparative condensate-1 | 85 | 7 | 25 |

Each composition in Table 1 is as follows.

Condensate-1 and Condensate-2 were obtained in Synthesis Examples 2 and 3, respectively, while Comparative Condensate-i was obtained in Comparative Example 1. PGMEA (propylene glycol methyl ether acetate) was used as an organic solvent, PAG1 and PAG2 having the following structural formulas were used as an acid generator; and tributylamine and BASE1, BASE2 and BASE3 having the following structural formulas were used as the basic compound.

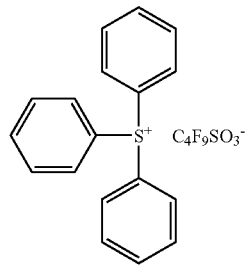
PAG1

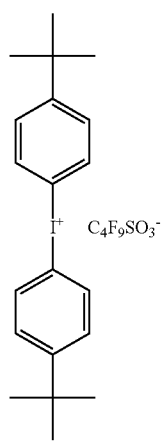
PAG2

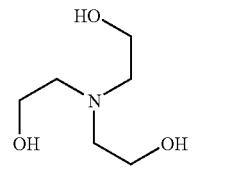
BASE1

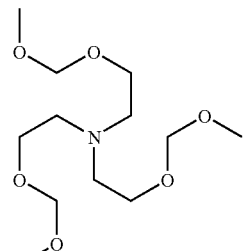
BASE2

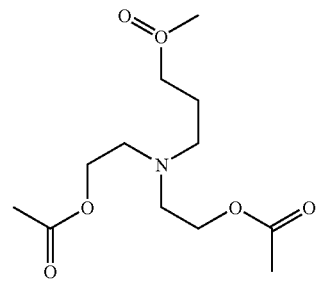
BASE3

Dry Etching Test

Each of the hydrolysates (1 g) obtained in Synthesis Examples 1 and 2 and Comparative Example 1 and 3 g of novolac containing m-cresol and p-cresol at a m-cresol/p-cresol ratio of 6/4 and having Mw of 8000 were dissolved sufficiently in 10 g of propylene glycol monomethyl ether acetate, respectively. The resulting solutions were filtered through a 0.2 μm filter to prepare polymer solutions.

Each polymer solutions was applied to a silicon wafer by spin coating, followed by baking at 110° C. for 60 seconds, whereby a polymer film of 200 nm thick was formed. In the case of novolac, the film having a thickness of 1000 nm was formed.

The wafers having each film applied thereon were dry etched under the following two conditions and a difference in the film thickness before and after etching was determined.

(1) Etching Test with $O_2$ Gas

A film difference before and after etching was determined using a dry etching apparatus "TE-8500P" of Tokyo Electron Co., Ltd.

The etching was conducted under the following conditions:

| Chamber pressure | 450 mT |
|---|---|
| RF power | 600 W |
| Ar gas flow rate | 40 sccm |
| $O_2$ gas flow rate | 60 sccm |
| Gap | 9 mm |
| Time | 60 seconds |

(2) Etching Test with a Cl$_2$/BCl$_3$ Gas

A film difference before and after etching was determined using a dry etching apparatus "L-507D-L" of Nichiden Anelva Co., Ltd.

The etching was conducted under the following conditions:

| | |
|---|---|
| Chamber pressure | 450 mmTorr |
| RF power | 300 W |
| Gap | 9 mm |
| Cl$_2$ gas flow rate | 30 sccm |
| BCl$_3$ gas flow rate | 30 sccm |
| CHF$_3$ gas flow rate | 100 sccm |
| O$_2$ gas flow rate | 2 sccm |
| Time | 60 seconds |

The results of etching test are shown in Table 2. In this evaluation, the compound having less film thickness difference, that is, showing a smaller film decrease is judged to have high etching resistance.

TABLE 2

| Condensate | Etching rate with O$_2$ gas (nm/min) | Etching rate with Cl$_2$/BCl$_3$ gas (nm/min) |
|---|---|---|
| Condensate-1 | 184 | 268 |
| Condensate-2 | 180 | 284 |
| Comparative Condensate-1 | 195 | 288 |
| Novolac | 8000 | 303 |

EVALUATION EXAMPLE OF RESIST

In 1000 parts by weight of a propylene glycol monomethyl ether acetate (PGMEA) solvent containing 0.01 wt. % of "FC-430" (product of Sumitomo 3M), Condensate-1, Condensate-2 or Comparative Condensate-1 as a silicone polymer, PAG1 or PAG2 as an acid generator and DRI as a dissolution inhibitor were dissolved sufficiently in accordance with the composition as shown in Table 3, followed by filtration through a 0.2 μm Teflon (trade mark) filter, whereby each resist solution was prepared.

"OFPR-800" (trade name; product of Tokyo Ohka Kogyo) was applied to a silicon wafer as a lower-layer novolac resist material, followed by curing by heating at 300° C. for 5 minutes to prepare a 0.5 μm film.

An antireflective film ("DUV-30", product of Brewer Science) was spin-coated and baked at 100° C. for 30 seconds and at 200° C. for 60 seconds to give a film thickness of 85 nm. A resist solution was spin-coated onto the cured DUV-30/novolac resist and baked at 140° C. for 60 seconds on a hot plate, whereby a film of 0.2 μm thick was obtained. The film was exposed to an ArF excimer laser stepper ("S305", product of Nikon, NA: 0.68, σ: 0.85, 2/3 zonal illumination, 6% halftone phase shift mask), baked (PEB) at 110° C. for 60 seconds, and developed for 60 seconds with a 2.38 wt. % aqueous solution of tetramethylammonium hydroxide (TMAH), whereby a positive pattern was obtained.

The resist pattern thus obtained was evaluated in the following manner. Results are shown in Table 3.

Evaluation Method:

Taking an exposure amount sufficient for resolution of a 0.13 μm lines and spaces at 1:1 as the optimum exposure amount (Eop), the minimum line width of the line and space separated at this exposure amount was designated as a resolution of the evaluated resist.

TABLE 3

| Composition | | | Evaluation results | |
|---|---|---|---|---|
| Base resin (parts by weight) | Acid generator (parts by weight) | Basic compound (parts by weight) | Sensitivity (mJ/cm) | Resolution (μm) |
| Condensate-1 (100) | PAG1 (2) | Tributylamine (0.5) | 23 | 0.11 |
| Condensate-2 (100) | PAG1 (2) | Tributylamine (0.5) | 21 | 0.11 |
| Condensate-1 (100) | PAG2 (3) | Tributylamine (0.4) | 27 | 0.11 |
| Condensate-1 (100) | PAG1 (2) | Base1 (0.6) | 18 | 0.10 |
| Condensate-1 (100) | PAG1 (2) | BASE2 (0.6) | 20 | 0.10 |
| Condensate-1 (100) | PAG1 (2) | BASE3 (0.6) | 22 | 0.10 |
| Condensate-1 (100) | PAG1 (2) | Tributylamine (0.5) | 16 | 0.11 |
| Comparative Condensate-1 (100) | PAG1 (2) | Tributylamine (0.5) | 12 | 0.13 |

The resist composition using the silicon-containing polymer according to the invention exhibited high resolution in ArF excimer laser lithography, high selectivity relative to the underlying novolac in etching with an oxygen gas, and etching resistance comparable to the novolac in etching with a chlorine gas.

The results of Table 1 show that the invention polymer shows transparency as high as up to 157 nm, those of Table 3 show that the positive resist material using the polymer of the invention not only exhibits adequate resolution and sensitivity but also has small ling edge roughness; and those of Table 2 show that it has excellent dry-etching resistance, judging from a small difference in the film thickness before and after etching.

The present invention is not limited to the above-described embodiments. They are only exemplary and any embodiments having a substantially similar constitution as the technical idea as described in the claims of the present invention and exhibit similar advantages are embraced within the technical scope of the present invention.

The present invention was described using, as an example, a chemically amplified positive resist material comprising an acid generator, a basic compound, a dissolution inhibitor and an organic solvent. The present invention is not limited thereto. Incorporation of the above-described additive is not essential, while another additive such as surfactant may be added as needed, or some components may be omitted.

In the present invention, a positive resist material comprising, as a base resin, a polymer obtained by polymerizing a substituted or unsubstituted (2-hydroxy-2,2-bistrifluoromethyl)ethyl-or hydroxytrifluormethyl-containing trimethoxysilyltricylcodecane exhibits a markedly high contrast in alkali dissolution rate before and after exposure, has high sensitivity and high resolution, has lessened line edge roughness, and moreover shows excellent etching resistance. According to the present invention, therefore, a positive resist material particularly suited as a micropattern forming material for ultra LSI devices, especially a chemically modified positive resist material for bilayer processing can be obtained.

The invention claimed is:

1. A method for preparing a polymer for a positive resist material,
the polymer comprising at least one monomer unit selected from a group consisting of a monomer unit (A), a monomer unit (B) and a monomer unit (C) represented by the following formula (1):

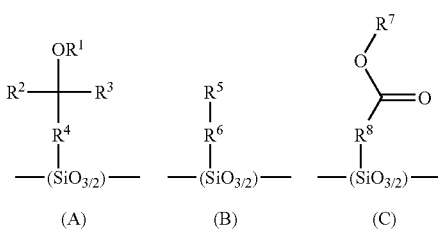

wherein $R^1$ represents a hydrogen atom, an alkyl group or an acyl group; $R^2$ and $R^3$ each independently represents a hydrogen atom, a fluorine atom, a $C_{1-4}$ alkyl group or a $C_{1-4}$ alkyl group having at least one fluorine atom; $R^5$ represents a halogen atom, an alkyl group, an oxoalkyl group, an acyl group, an acyloxy group, or an alkoxycarbonyl group; $R^7$ represents an acid-labile group; and $R^4$, $R^6$ and $R^8$ each independently represents a linear, branched, cyclic or bridged cyclic $C_{3-20}$ alkylene group or a $C_{6-20}$ arylene group; and having a glass transition temperature (Tg) of 100° C. or greater; and the method comprising the steps of:
preparing a polysilsesquioxane by hydrolysis and condensation at a temperature from 0 to 100° C. of a monomer or monomers corresponding to the selected monomer unit and being selected from monomers represented by the following formula (2):

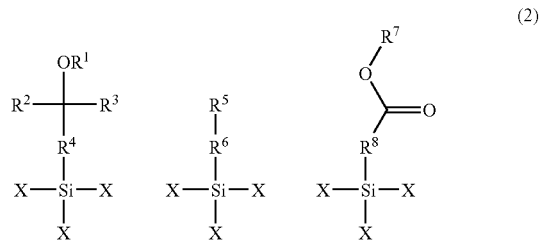

wherein X may be the same or different and each represents a $C_{1-10}$ alkyl group, an aryl group, a trifluoropropyl group, a hydroxyl group, a $C_{1-4}$ alkoxy group or a halogen atom and at least two of the three X groups in one compound are each a hydroxyl group, a $C_{1-4}$ alkoxy group or a halogen atom; and when chlorosilane is used, a hydroxyl group in an organic side chain is acetylated or pivaloylated so as to prevent a reaction between the chlorosilane and the hydroxyl group;

dehydrating the obtained polysilsesquioxane; and
maturing the dehydrated polysilsesquioxane under an anhydrous condition at a temperature from 80 to 200° C. in the presence of a basic catalyst so as to heighten a condensation degree of the polysilsesquioxane.

2. The method for preparing a polymer for a positive resist material according to claim 1 wherein said basic catalyst is in an amount of 10 mol % or greater relative to the monomer unit.

3. The method for preparing a polymer for a positive resist material according to claim 1, wherein said basic catalyst is selected from the group consisting of sodium hydroxide, potassium hydroxide, tetramethylammonium hydroxide, tetraethylammonium hydroxide, choline hydroxide, 1,8-diazabicyclo[5.4.0]-7-undecene (DBU), and 1,5-diazabicyclo[4.3.0]-5-nonenone (DBN).

4. A method for preparing a positive resist material comprising the steps of:
providing a polymer for the positive resist material prepared according to claim 1, and
adding an organic solvent and an acid generator thereto.

5. A pattern formation method, comprising the steps of:
providing a positive resist material prepared according to claim 4,
coating a substrate with said positive resist material,
heating the coated substrate,
exposing the heated substrate to high energy radiation or an electron beam having a wavelength of 300 nm or less through a photomask,
optionally heating the exposed substrate, and
developing with a developer.

6. The pattern formation method according to claim 5 further comprising a step of treating said substrate with oxygen plasma etching after said developing step.

7. The pattern formation method according to claim 5 further comprising a step of treating said substrate with halogen gas etching after said developing step, the halogen gas containing chlorine or bromine.

8. A method for preparing a polymer for a positive resist material, the polymer comprising at least one monomer unit selected from a group consisting of a monomer unit (A), a monomer unit (B) and a monomer unit (C) represented by the following formula (1):

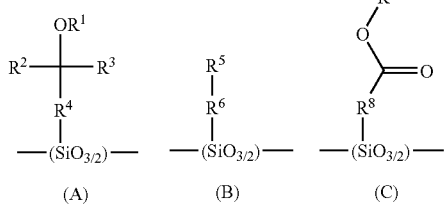

wherein $R^1$ represents a hydrogen atom, an alkyl group or an acyl group; $R^2$ and $R^3$ each independently represents a hydrogen atom, a fluorine atom, a $C_{1-4}$ alkyl group or a $C_{1-4}$ alkyl group having at least one fluorine atom; $R^5$ a halogen atom, an alkyl group, an oxoalkyl group, an acyl group, an acyloxy group, or an alkoxycarbonyl group; $R^7$ represents an acid-labile group; and $R^4$, $R^6$ and $R^8$ each independently represents a linear, branched, cyclic or bridged cyclic $C_{3-20}$ alkylene group or a $C_{6-20}$ arylene group; and having a glass transition temperature (Tg) of 100° C. or greater; and the method comprising the steps of:

hydrolyzing and condensing at a temperature from 10 to 80°C., in the presence of a catalyst and an organic solvent, a monomer or monomers corresponding to the selected monomer unit and being selected from monomers represented by the following formula (2):

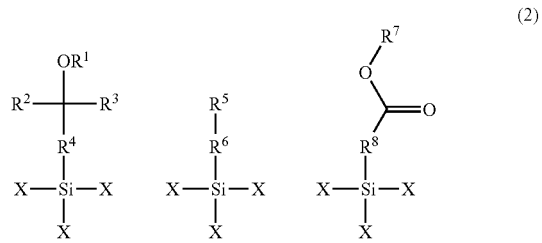

wherein X may be the same or different and each represents a $C_{1-10}$ alkyl group, an aryl group, a trifluoropropyl group, a hydroxyl group, a $C_{1-4}$ alkoxy group or a halogen atom and at least two of the three X groups in one compound are each a hydroxyl group, a $C_{1-4}$ alkoxy group or a halogen atom; and when chlorosilane is used, a hydroxyl group in an organic side chain is acetylated or pivaloylated so as to prevent a reaction between the chlorosilane and the hydroxyl group, to prepare a polysilsesquioxane;

neutralizing the catalyst;

separating a polysilsesquioxane-containing organic solvent phase from a resulting reaction mixture;

dehydrating the organic solvent layer to obtain a dehydrated polysilsesquioxane; and maturing the dehydrated polysilsesquioxane under an anhydrous condition at a temperature from 100 to 170°C. in the presence of a basic catalyst so as to heighten a condensation degree of the polysilsesquioxane.

* * * * *

UNITED STATES PATENT AND TRADEMARK OFFICE
CERTIFICATE OF CORRECTION

PATENT NO. : 7,651,829 B2 Page 1 of 2
APPLICATION NO. : 10/854568
DATED : January 26, 2010
INVENTOR(S) : Hamada et al.

It is certified that error appears in the above-identified patent and that said Letters Patent is hereby corrected as shown below:

Column 39,

In the formula:

" 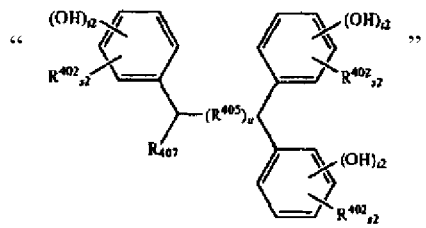 ", should read:

-- 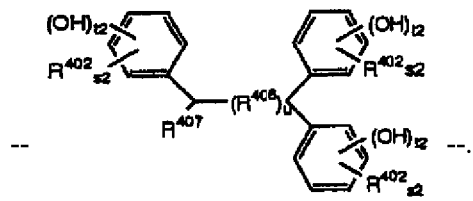 --.

Signed and Sealed this

Fifth Day of October, 2010

David J. Kappos
*Director of the United States Patent and Trademark Office*

Column 39, (continued)
In the formula:
" 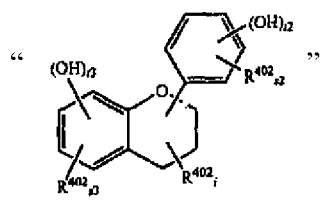 "
should read:
-- 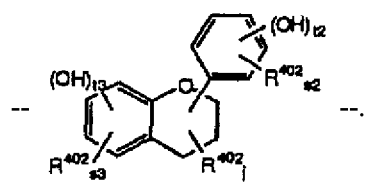 --.
Column 48,
In the formula, BASE3:
" 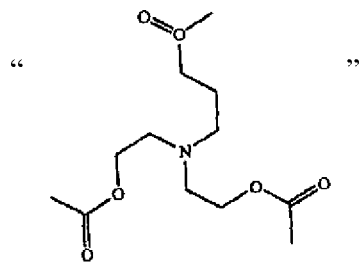 "
should read:
-- 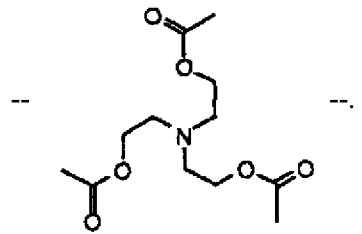 --.
Column 53,
Line 24, after "$R^5$" insert --represents--.